United States Patent
Namboodiri et al.

(10) Patent No.: US 11,152,957 B2
(45) Date of Patent: Oct. 19, 2021

(54) FORWARD ERROR CORRECTION USING NON-BINARY LOW DENSITY PARITY CHECK CODES

(71) Applicant: Cohere Technologies, Inc., Santa Clara, CA (US)

(72) Inventors: Vamadevan Namboodiri, Santa Clara, CA (US); Ronny Hadani, Santa Clara, CA (US); Stuart Abrams, Santa Clara, CA (US)

(73) Assignee: Cohere Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/651,020

(22) PCT Filed: Sep. 29, 2018

(86) PCT No.: PCT/US2018/053655
§ 371 (c)(1),
(2) Date: Mar. 26, 2020

(87) PCT Pub. No.: WO2019/068053
PCT Pub. Date: Apr. 4, 2019

(65) Prior Publication Data
US 2020/0313695 A1    Oct. 1, 2020

Related U.S. Application Data

(60) Provisional application No. 62/566,190, filed on Sep. 29, 2017.

(51) Int. Cl.
*H03M 13/11* (2006.01)
*H03M 13/25* (2006.01)
(Continued)

(52) U.S. Cl.
CPC ...... *H03M 13/1171* (2013.01); *H03M 13/116* (2013.01); *H03M 13/1174* (2013.01);
(Continued)

(58) Field of Classification Search
CPC .................. H03M 13/1171; H03M 13/116
See application file for complete search history.

(56) References Cited

U.S. PATENT DOCUMENTS 4,754,493 A    6/1988   Coates
5,083,135 A    1/1992   Nagy et al.
(Continued)

FOREIGN PATENT DOCUMENTS

CN    1235720 A      11/1999
CN    101682316 A    3/2010
(Continued)

OTHER PUBLICATIONS

Sarah J. Johnson and Steven R. Weller, Practical Interleavers for Systematic Repeat-Accumulate Codes, Conference: Proceedings of the 63rd IEEE Vehicular Technology Conference, VTC Spring 2006, May 7-10, 2006, Melbourne, Australia (Year: 2006).*
(Continued)

*Primary Examiner* — Joseph D Torres
(74) *Attorney, Agent, or Firm* — Perkins Coie LLP

(57) ABSTRACT

Methods, systems and devices for forward error correction in orthogonal time frequency space (OTFS) communication systems using non-binary low-density parity-check (NB-LDPC) codes are described. One exemplary method for forward error correction includes receiving data, encoding the data via a non-binary low density parity check (NB-LDPC) code, wherein the NB-LDPC code is characterized by a matrix with binary and non-binary entries, modulating the encoded data to generate a signal, and transmitting the signal. Another exemplary method for forward error correc-
(Continued)

tion includes receiving a signal, demodulating the received signal to produce data, decoding the data via a NB-LDPC code, wherein the NB-LDPC code is characterized by a matrix with binary and non-binary entries, and providing the decoded data to a data sink.

19 Claims, 29 Drawing Sheets

(51) Int. Cl.
  *H03M 13/29* (2006.01)
  *H03M 13/39* (2006.01)
  *H03M 13/00* (2006.01)
(52) U.S. Cl.
  CPC ..... *H03M 13/1185* (2013.01); *H03M 13/255* (2013.01); *H03M 13/2906* (2013.01); *H03M 13/3927* (2013.01); *H03M 13/611* (2013.01)

(56) References Cited

U.S. PATENT DOCUMENTS

| | | |
|---|---|---|
| 5,182,642 A | 1/1993 | Gersdorff et al. |
| 5,623,511 A | 4/1997 | Bar-David et al. |
| 5,831,977 A | 11/1998 | Dent |
| 5,872,542 A | 2/1999 | Simons et al. |
| 5,956,624 A | 9/1999 | Hunsinger et al. |
| 6,212,246 B1 | 4/2001 | Hendrickson |
| 6,289,063 B1 | 9/2001 | Duxbury |
| 6,356,555 B1 | 3/2002 | Rakib et al. |
| 6,388,621 B1 | 5/2002 | Lynch |
| 6,426,983 B1 | 7/2002 | Rakib et al. |
| 6,608,864 B1 | 8/2003 | Strait |
| 6,631,168 B2 | 10/2003 | Izumi |
| 6,704,366 B1 | 3/2004 | Combes et al. |
| 6,956,814 B1 | 10/2005 | Campanella |
| 7,010,048 B1 | 3/2006 | Shattil |
| 7,327,812 B2 | 2/2008 | Auer |
| 7,392,018 B1 | 6/2008 | Ebert et al. |
| 7,689,049 B2 | 3/2010 | Monro |
| 7,773,685 B2 | 8/2010 | Tirkkonen et al. |
| 7,864,877 B2 | 1/2011 | Hottinen |
| 8,229,017 B1 | 7/2012 | Lee et al. |
| 8,259,845 B2 | 9/2012 | Dent |
| 8,401,131 B2 | 3/2013 | Fety et al. |
| 8,547,988 B2 | 10/2013 | Hadani et al. |
| 8,619,892 B2 | 12/2013 | Vetter et al. |
| 8,717,210 B2 | 5/2014 | Eldar et al. |
| 8,879,378 B2 | 11/2014 | Rakib et al. |
| 8,892,048 B1 | 11/2014 | Turner |
| 8,976,851 B2 | 3/2015 | Hadani et al. |
| 9,031,141 B2 | 5/2015 | Hadani et al. |
| 9,071,285 B2 | 6/2015 | Hadani et al. |
| 9,071,286 B2 | 6/2015 | Hadani et al. |
| 9,083,483 B1 | 7/2015 | Rakib et al. |
| 9,083,595 B2 | 7/2015 | Rakib et al. |
| 9,130,638 B2 | 9/2015 | Hadani et al. |
| 9,166,728 B2* | 10/2015 | Djordjevic ......... H04B 10/5055 |
| 9,282,528 B2 | 3/2016 | Hashimoto |
| 9,294,315 B2 | 3/2016 | Hadani et al. |
| 9,444,514 B2 | 9/2016 | Hadani et al. |
| 9,548,840 B2 | 1/2017 | Hadani et al. |
| 9,553,984 B2 | 1/2017 | Krause et al. |
| 9,590,779 B2 | 3/2017 | Hadani et al. |
| 9,634,719 B2 | 4/2017 | Rakib et al. |
| 9,660,851 B2 | 5/2017 | Hadani et al. |
| 9,668,148 B2 | 5/2017 | Hadani et al. |
| 9,712,354 B2 | 7/2017 | Hadani et al. |
| 9,729,281 B2 | 8/2017 | Hadani et al. |
| 2001/0031022 A1 | 10/2001 | Petrus et al. |
| 2001/0033614 A1 | 10/2001 | Hudson |
| 2001/0046205 A1 | 11/2001 | Easton et al. |
| 2002/0001308 A1 | 1/2002 | Heuer |
| 2002/0034191 A1 | 3/2002 | Shattil |
| 2002/0181388 A1 | 12/2002 | Jain et al. |
| 2002/0181390 A1 | 12/2002 | Mody et al. |
| 2002/0181607 A1 | 12/2002 | Izumi |
| 2003/0073464 A1 | 4/2003 | Giannakis et al. |
| 2003/0185295 A1 | 10/2003 | Yousef |
| 2003/0235147 A1 | 12/2003 | Walton et al. |
| 2004/0044715 A1 | 3/2004 | Aldroubi et al. |
| 2004/0174812 A1 | 9/2004 | Murakami et al. |
| 2004/0189581 A1 | 9/2004 | Sako et al. |
| 2004/0218523 A1 | 11/2004 | Varshney et al. |
| 2005/0157778 A1 | 7/2005 | Trachewsky et al. |
| 2005/0157820 A1 | 7/2005 | Wongwirawat et al. |
| 2005/0180517 A1 | 8/2005 | Abe |
| 2005/0207334 A1 | 9/2005 | Hadad |
| 2005/0251844 A1 | 11/2005 | Martone et al. |
| 2006/0008021 A1 | 1/2006 | Bonnet |
| 2006/0039270 A1 | 2/2006 | Strohmer et al. |
| 2007/0014272 A1 | 1/2007 | Palanki et al. |
| 2007/0038691 A1 | 2/2007 | Candes et al. |
| 2007/0078661 A1 | 4/2007 | Sriram et al. |
| 2007/0104283 A1 | 5/2007 | Han et al. |
| 2007/0110131 A1 | 5/2007 | Guess et al. |
| 2007/0136635 A1* | 6/2007 | Niu ............. H03M 13/116 714/752 |
| 2007/0211952 A1 | 9/2007 | Faber et al. |
| 2007/0237181 A1 | 10/2007 | Cho et al. |
| 2007/0253465 A1 | 11/2007 | Muharemovic et al. |
| 2007/0253504 A1 | 11/2007 | Hasegawa |
| 2008/0043857 A1 | 2/2008 | Dias et al. |
| 2008/0117999 A1 | 5/2008 | Kadous et al. |
| 2008/0186843 A1 | 8/2008 | Ma et al. |
| 2008/0187062 A1 | 8/2008 | Pan et al. |
| 2008/0232504 A1 | 9/2008 | Ma et al. |
| 2008/0310383 A1 | 12/2008 | Kowalski |
| 2009/0080403 A1 | 3/2009 | Hamdi |
| 2009/0092259 A1 | 4/2009 | Jot et al. |
| 2009/0103593 A1 | 4/2009 | Bergamo |
| 2009/0122854 A1 | 5/2009 | Zhu et al. |
| 2009/0161804 A1 | 6/2009 | Chrabieh et al. |
| 2009/0204627 A1 | 8/2009 | Hadani |
| 2009/0222226 A1 | 9/2009 | Baraniuk et al. |
| 2009/0303961 A1 | 12/2009 | Popovic et al. |
| 2010/0001901 A1 | 1/2010 | Baraniuk et al. |
| 2010/0008432 A1 | 1/2010 | Kim et al. |
| 2010/0027608 A1 | 2/2010 | Priotti |
| 2010/0111138 A1 | 5/2010 | Hosur et al. |
| 2010/0142476 A1 | 6/2010 | Jiang et al. |
| 2010/0187914 A1 | 7/2010 | Rada et al. |
| 2010/0238787 A1 | 9/2010 | Guey |
| 2010/0277308 A1 | 11/2010 | Potkonjak |
| 2010/0303136 A1 | 12/2010 | Ashikhmin et al. |
| 2010/0322349 A1 | 12/2010 | Lee et al. |
| 2011/0007789 A1 | 1/2011 | Garmany |
| 2011/0110532 A1 | 5/2011 | Svendsen |
| 2011/0116489 A1 | 5/2011 | Grandhi |
| 2011/0116516 A1 | 5/2011 | Hwang et al. |
| 2011/0126071 A1 | 5/2011 | Han et al. |
| 2011/0131463 A1 | 6/2011 | Gunnam |
| 2011/0216808 A1 | 9/2011 | Tong et al. |
| 2011/0286502 A1 | 11/2011 | Adachi et al. |
| 2011/0287778 A1 | 11/2011 | Levin et al. |
| 2011/0292971 A1 | 12/2011 | Hadani et al. |
| 2011/0293030 A1 | 12/2011 | Rakib et al. |
| 2011/0299379 A1 | 12/2011 | Sesia et al. |
| 2011/0305267 A1 | 12/2011 | Riu et al. |
| 2012/0021769 A1 | 1/2012 | Lindoff et al. |
| 2012/0051457 A1 | 3/2012 | Ma et al. |
| 2012/0140716 A1 | 6/2012 | Baldemair et al. |
| 2012/0170684 A1 | 7/2012 | Yim et al. |
| 2012/0201322 A1 | 8/2012 | Rakib et al. |
| 2012/0213098 A1 | 8/2012 | Sun |
| 2012/0235795 A1 | 9/2012 | Liao et al. |
| 2012/0269201 A1 | 10/2012 | Atungsiri et al. |
| 2012/0272117 A1 | 10/2012 | Stadelmeier et al. |
| 2012/0320994 A1 | 12/2012 | Loghin et al. |
| 2013/0021977 A1 | 1/2013 | Yang et al. |
| 2013/0058390 A1 | 3/2013 | Haas et al. |
| 2013/0077579 A1 | 3/2013 | Cho et al. |
| 2013/0083661 A1 | 4/2013 | Gupta et al. |

(56) References Cited

U.S. PATENT DOCUMENTS

| | | | |
|---|---|---|---|
| 2013/0121497 | A1 | 5/2013 | Smaragdis et al. |
| 2013/0230010 | A1 | 9/2013 | Kim et al. |
| 2013/0246894 | A1* | 9/2013 | Declercq ............ H03M 13/1171 714/792 |
| 2013/0260787 | A1 | 10/2013 | Hashimoto |
| 2013/0279627 | A1 | 10/2013 | Wu et al. |
| 2013/0315133 | A1 | 11/2013 | Wang et al. |
| 2014/0143639 | A1 | 5/2014 | Loghin et al. |
| 2014/0161154 | A1 | 6/2014 | Hadani et al. |
| 2014/0169385 | A1 | 6/2014 | Hadani et al. |
| 2014/0169406 | A1 | 6/2014 | Hadani et al. |
| 2014/0169433 | A1 | 6/2014 | Hadani et al. |
| 2014/0169436 | A1 | 6/2014 | Hadani et al. |
| 2014/0169437 | A1 | 6/2014 | Hadani et al. |
| 2014/0169441 | A1 | 6/2014 | Hadani et al. |
| 2014/0247803 | A1 | 9/2014 | Arambepola et al. |
| 2014/0348252 | A1 | 11/2014 | Siohan et al. |
| 2014/0364128 | A1 | 12/2014 | Lee et al. |
| 2015/0003499 | A1* | 1/2015 | Boutillon ................ H04B 1/69 375/146 |
| 2015/0104168 | A1* | 4/2015 | Djordjevic .......... H04L 27/2649 398/44 |
| 2015/0117395 | A1 | 4/2015 | Hadani et al. |
| 2015/0326273 | A1* | 11/2015 | Rakib ................ H04B 7/0626 375/131 |
| 2015/0327085 | A1 | 11/2015 | Hadani et al. |
| 2015/0382231 | A1 | 12/2015 | Jabbar et al. |
| 2016/0043835 | A1 | 2/2016 | Hadani et al. |
| 2016/0135132 | A1 | 5/2016 | Donepudi et al. |
| 2016/0182269 | A1 | 6/2016 | Hadani et al. |
| 2016/0191217 | A1 | 6/2016 | Hadani et al. |
| 2016/0191280 | A1 | 6/2016 | Hadani et al. |
| 2016/0254889 | A1 | 9/2016 | Shattil |
| 2016/0277225 | A1 | 9/2016 | Frenne et al. |
| 2016/0309345 | A1 | 10/2016 | Tehran et al. |
| 2016/0380743 | A1 | 12/2016 | Rakib |
| 2016/0381576 | A1 | 12/2016 | Hadani et al. |
| 2017/0012749 | A1 | 1/2017 | Rakib et al. |
| 2017/0012810 | A1 | 1/2017 | Rakib et al. |
| 2017/0019297 | A1 | 1/2017 | Rakib |
| 2017/0033899 | A1 | 2/2017 | Rakib et al. |
| 2017/0040711 | A1 | 2/2017 | Rakib et al. |
| 2017/0078054 | A1 | 3/2017 | Hadani et al. |
| 2017/0099122 | A1 | 4/2017 | Hadani et al. |
| 2017/0099607 | A1 | 4/2017 | Hadani et al. |
| 2017/0149594 | A1 | 5/2017 | Rakib et al. |
| 2017/0149595 | A1 | 5/2017 | Rakib et al. |
| 2017/0201354 | A1 | 7/2017 | Hadani et al. |
| 2017/0207817 | A1 | 7/2017 | Hadani et al. |
| 2017/0222700 | A1 | 8/2017 | Hadani et al. |
| 2017/0230215 | A1 | 8/2017 | Rakib et al. |
| 2017/0244524 | A1 | 8/2017 | Hadani et al. |

FOREIGN PATENT DOCUMENTS

| | | |
|---|---|---|
| CN | 101939935 A | 1/2011 |
| EP | 1432168 A1 | 6/2004 |
| JP | 2011127910 A | 6/2011 |
| WO | 2007004297 | 1/2007 |
| WO | 2011137699 A1 | 11/2011 |
| WO | 2011150315 | 12/2011 |
| WO | 2013148546 | 10/2013 |
| WO | 2014004585 | 1/2014 |
| WO | 2016014596 | 1/2016 |
| WO | 2016014598 | 1/2016 |
| WO | 2016176642 | 11/2016 |
| WO | 2016183230 | 11/2016 |
| WO | 2016183240 | 11/2016 |
| WO | 2016209848 | 12/2016 |
| WO | 2017003952 | 1/2017 |
| WO | 2017011478 | 1/2017 |

OTHER PUBLICATIONS

Office Action for U.S. Appl. No. 13/117,119, dated Aug. 5, 2013, 5 pages.
Notice of Allowance for U.S. Appl. No. 13/117,119, dated Feb. 28, 2014, 13 pages.
Banelli, P. et al., "Modulation Formats and Waveforms for 5G Networks: Who Will Be the Heir of OFDM?," IEEE Signal Processing Magazine, vol. 81, pp. 80-93, Nov. 2014.
El Hattachi, R. et al., "NGMN 5G Initiative White Paper," NGMN Alliance, Feb. 17, 2015. [Online], Available: https://www.ngmn.org/uploads/media/NGMN_5G_White_Paper_V1_0.pdf, 125 pages.
Rusek, F et al., "Scaling Up MIMO, Opportunities and Challenges with Very Large Arrays," IEEE Signal Processing Magazine, pp. 40-60 (2013).
Vodafone, "Cellular Internet of Things: Architectural Aspects," RP-150869, 3GPP RAN#68, Malmo, Sweden (Jun. 9, 2015), 19 pages.
Supplementary European Search Report for European Application No. 11787483.4, dated Sep. 9, 2014, 6 pages.
International Search Report and Written Opinion for International Application No. PCT/US2011/038302, dated Nov. 15, 2011, 8 pages.
International Preliminary Report on Patentability for International Application No. PCT/US2011/038302, dated Dec. 4, 2012, 7 pages.
Office Action for U.S. Appl. No. 13/117,124, dated Feb. 22, 2013, 7 pages.
Notice of Allowance for U.S. Appl. No. 13/117,124, dated Aug. 8, 2013, 10 pages.
Office Action for U.S. Appl. No. 14/605,957, dated Jun. 22, 2017, 6 pages.
Supplementary European Search Report for European Application No. 13809004.8, dated Apr. 14, 2016, 8 pages.
Communication Pursuant to Article 94(3) EPC for European Application No. 13809004.8, dated Feb. 17, 2017, 5 pages.
Notice of Allowance for U.S. Appl. No. 13/927,087, dated Feb. 25, 2015, 9 pages.
Office Action for U.S. Appl. No. 13/927,087, dated Nov. 12, 2014, 14 pages.
Gurevich, S. et al. "Group Representation Design of Digital Signals and Sequences," S.W. Golomb et al. (eds.), SETA 2008, LNCS 5203, pp. 153-166, Springer-Verlag Berlin Heidelberg (2008).
International Search Report and Written Opinion for International Application No. PCT/US2013/047723, dated Oct. 29, 2013, 17 pages.
International Preliminary Report on Patentability for International Application No. PCT/US2013/047723, dated Dec. 31, 2014, 15 pages.
Notice of Allowance for U.S. Appl. No. 13/927,088, dated Feb. 18, 2015, 7 pages.
Office Action for U.S. Appl. No. 13/927,088, dated Nov. 28, 2014, 13 pages.
Notice of Allowance for U.S. Appl. No. 13/927,086, dated Dec. 26, 2014, 8 pages.
Supplemental Notice of Allowability for U.S. Appl. No. 13/927,086, dated Mar. 19, 2015, 4 pages.
Office Action for U.S. Appl. No. 13/927,086, dated Oct. 14, 2014, 10 pages.
Office Action for U.S. Appl. No. 13/927,089, dated Dec. 24, 2014, 13 pages.
Office Action for U.S. Appl. No. 13/927,089, dated Aug. 14, 2015, 7 pages.
Supplemental Notice of Allowability for U.S. Appl. No. 13/927,091, dated Jun. 11, 2015, 4 pages.
Notice of Allowance for U.S. Appl. No. 13/927,091, dated Apr. 24, 2015, 8 pages.
Office Action for U.S. Appl. No. 13/927,091, dated Jan. 27, 2015, 15 pages.
Office Action for U.S. Appl. No. 13/927,092, dated Oct. 8, 2014, 5 pages.
Notice of Allowance for U.S. Appl. No. 13/927,092, dated Oct. 24, 2014, 7 pages.
Office Action for U.S. Appl. No. 13/927,095, dated Apr. 30, 2015, 11 pages.

(56) References Cited

OTHER PUBLICATIONS

Office Action for U.S. Appl. No. 13/927,095, dated Nov. 4, 2015, 9 pages.
Office Action for U.S. Appl. No. 13/927,095, dated Jun. 1, 2016, 10 pages.
Office Action for U.S. Appl. No. 14/717,886, dated Apr. 19, 2016, 10 pages.
Office Action for U.S. Appl. No. 14/709,377, dated Dec. 11, 2015, 12 pages.
Office Action for U.S. Appl. No. 14/709,377, dated Jul. 13, 2016, 17 pages.
Examination Report No. 1 for Australian Application No. 2013239970, dated Dec. 8, 2015, 3 pages.
"AT&T Annual Report 2014," Opening Our Network [Online]. Retrieved from the Internet Sep. 22, 2016. <URL: http://www.att.com/Investor/ATT_Annual/2014/att_introduces_new_concepts_for_telecom_network.html>, 5 pages.
CATT, "UL ACK/NACK transmission methods for LTE-A," 3GPP TSG RAN WG1 Meeting #60bis, R1-102453, Beijing, China, Apr. 12-16, 2010, 8 pages.
Toskala, A. et al., "Physical Layer," Chapter 5 In: "LTE for UMTS: OFDMA and SC-FDMA Based Radio Access," Holma, H. et al. (eds.), John Wiley & Sons, Ltd., United Kingdom, 2009, pp. 83-135.
Mecklenbrauker, W., "A Tutorial on Non-Parametric Bilinear Time-Frequency Signal Representations," In: Time and Frequency Representation of Signals and Systems, Longo, G. et al. (eds.), Springer-Verlag Wien, vol. 309, pp. 11-68 (1989).
Nehorai, A et al., "MURI: Adaptive waveform design for full spectral dominance (2005-2010)," AFOSR FA9550-05-1-0443, Final Report, [online], Mar. 11, 2011 Retrieved on May 11, 2013, Retrieved from the Internet <URL: http://oai.dtic.mil/oai/oai?verb=getRecord&metadataPrefix=html&identifier=ADA565420>, 103 pages.
Office Action for Japanese Application No. 2015-518647, dated Jul. 7, 2015, 10 pages.
Office Action for U.S. Appl. No. 14/754,596, dated Apr. 19, 2016, 18 pages.
Office Action for U.S. Appl. No. 14/809,129, dated Jul. 19, 2016, 5 pages.
Office Action for U.S. Appl. No. 15/617,962, dated Sep. 6, 2017, 10 pages.
International Search Report and Written Opinion for International Application No. PCT/US2016/050825, dated Feb. 8, 2017, 12 pages.
International Search Report and Written Opinion for International Application No. PCT/US2016/052524, dated Dec. 20, 2016, 8 pages.
Office Action for U.S. Appl. No. 15/374,995, dated Aug. 7, 2017, 6 pages.
International Search Report and Written Opinion for International Application No. PCT/US2017/025797, dated Jun. 21, 2017, 6 pages.
International Search Report and Written Opinion for International Application No. PCT/US2016/030259, dated Aug. 4, 2016, 13 pages.
Office Action for U.S. Appl. No. 15/152,464, dated Apr. 6, 2017, 10 pages.
Examination Report No. 1 for Australian Application No. 2013280487, dated May 2, 2016, 3 pages.
International Search Report and Written Opinion for International Application No. PCT/US2016/031928, dated Oct. 7, 2016, 10 pages.
Office Action for U.S. Appl. No. 15/188,946, dated May 8, 2017, 14 pages.
International Search Report and Written Opinion for International Application No. PCT/US2016/038584, dated Sep. 26, 2016, 8 pages.
Office Action for U.S. Appl. No. 15/187,668, dated Feb. 16, 2017, 6 pages.
International Search Report and Written Opinion for International Application No. PCT/US2016/031909, dated Aug. 11, 2016, 13 pages.
Office Action for U.S. Appl. No. 15/194,494, dated May 5, 2017, 16 pages.
International Search Report and Written Opinion for International Application No. PCT/US2016/039662, dated Nov. 29, 2016, 14 pages.
Office Action for U.S. Appl. No. 15/436,653, dated Jun. 2, 2017, 10 pages.
Office Action for U.S. Appl. No. 15/208,545, dated Aug. 21, 2017, 15 pages.
International Search Report and Written Opinion for International Application No. PCT/US2016/041940, dated Oct. 20, 2016, 8 pages.
Supplementary European Search Report for European Application No. 13768150.8, dated Oct. 30, 2015, 7 pages.
International Search Report and Written Opinion for International Application No. PCT/US2013/033652, dated Jun. 12, 2013, 8 pages.
International Search Report and Written Opinion for International Application No. PCT/US2015/041417, dated Oct. 1, 2015, 7 pages.
Office Action for U.S. Appl. No. 14/805,407, dated Dec. 14, 2016, 7 pages.
International Search Report and Written Opinion for International Application No. PCT/US2015/041420, dated Oct. 1, 2015, 6 pages.

* cited by examiner

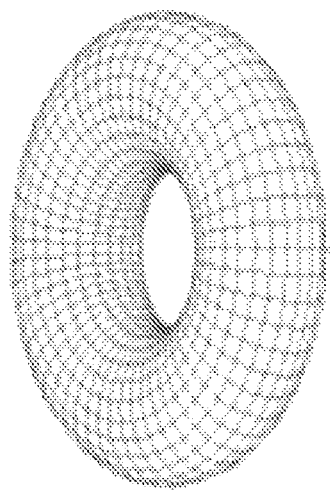
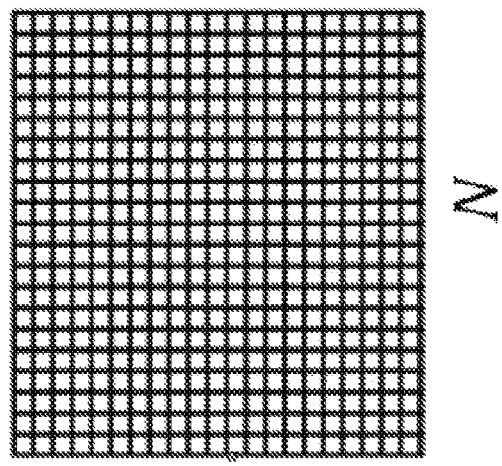
FIG. 6

FORWARD ERROR CORRECTION USING NON-BINARY LOW DENSITY PARITY CHECK CODES

CROSS-REFERENCE TO RELATED APPLICATION(S)

This patent document is a 371 National Phase Application of PCT Application No. PCT/US2018/053655 entitled "FORWARD ERROR CORRECTION USING NON-BINARY LOW DENSITY PARITY CHECK CODES" filed on Sep. 29, 2018 which claims priority to and benefits of U.S. Provisional Patent Application No. 62/566,190 entitled "FORWARD ERROR CORRECTION USING NON-BINARY LOW DENSITY PARITY CHECK CODES" filed on Sep. 29, 2017. The entire content of the aforementioned patent application is incorporated by reference as part of the disclosure of this patent document.

TECHNICAL FIELD

The present document relates to wireless communication, and more specifically, to forward error corrections codes used therein.

BACKGROUND

Forward error correction is used in a wide variety of devices including wireless communications systems, wired communications systems, optical communication systems, disk drives, as well as many others. Forward error correction adds redundancy to transmitted information that allows for correction of errors at a receiver. For example, errors caused by noise in a transmission channel between a transmitter and receiver may be corrected at the receiver. Low density parity check codes provide excellent forward error correction performance but new techniques are needed to improve their performance even more.

SUMMARY

This document relates to methods, systems, and devices for forward error correction in orthogonal time frequency space (OTFS) communication systems using non-binary low-density parity-check (NB-LDPC) codes. Embodiments of the disclosed technology formulate a parity-check matrix that includes non-binary entries, which provides better permutations, thereby lessening error triggering events and producing extremely low error floors such as $10^{-11}$ or $10^{-12}$.

In one exemplary aspect, a method for forward error correction is disclosed. The method includes receiving information bits, encoding the information bits via a non-binary low density parity check (NB-LDPC) code, wherein the NB-LDPC code is formulated as a matrix with binary and non-binary entries, modulating the encoded information bits to generate a signal, and transmitting the signal. The signal is modulated using an OTFS or OFDM modulation scheme.

In another exemplary aspect, a method for forward error correction is disclosed. The method includes receiving a signal, demodulating the received signal to produce data, decoding the data via a NB-LDPC code, wherein the NB-LDPC code is formulated as a matrix with binary and non-binary entries, and providing the decoded data to a data sink.

In yet another exemplary aspect, the above-described method(s) are embodied in the form of processor-executable code and stored in a computer-readable program medium.

In yet another exemplary aspect, a device that is configured or operable to perform the above-described methods is disclosed.

The above and other aspects and their implementations are described in greater detail in the drawings, the descriptions, and the claims.

BRIEF DESCRIPTION OF THE DRAWINGS

FIG. 6 shows an example of a periodic transform.

DETAILED DESCRIPTION

Figure 1:
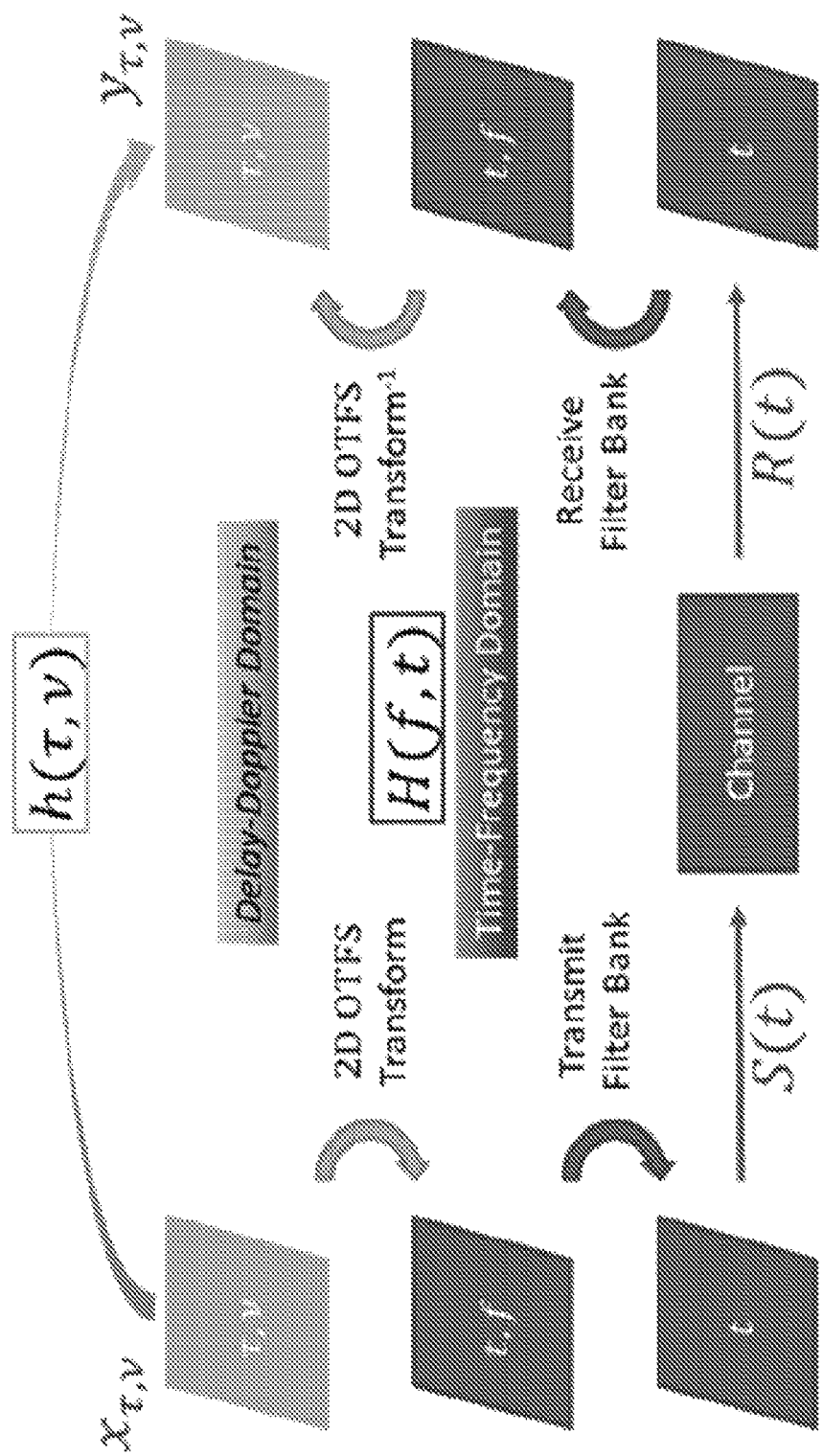
FIG. 1 shows an example of a transformation in the OTFS domain.

Section headings are used in the present document to improve readability of the description and do not, in any way, limit the discussion to the respective sections only. Section headings are used only to facilitate readability and are not intended to limit the embodiments and technology described in each section only to that section. Furthermore, for ease of explanation, a number of simplifying assumptions have been made. Although these simplifying assumptions are intended to help convey ideas, they are not intended to be limiting.

Next generation of applications and services that use wireless transmission will demand high reliability of data transmission. For example, it is expected that applications such as autonomous vehicle driving and medical patient care may rely on wireless transmission. Therefore, it is becoming important to provide very high reliability and low error rate of data transmission in wireless networks.

Traditional error correction codes often are not able to meet the stringent bit error rate (BER) requirements of the next generation wireless networks. In some cases, the codes may mathematically allow for very low BER operations, but the computational complexity for such implementations may be excessive for next generation wireless devices. For example, many devices may be powered from a battery that is not easily replaceable (e.g., machine to machine communication devices) or may have minimal power storage capability (e.g., IoT devices, wireless devices with small, thin form factors).

The techniques provided in the present document overcome these challenges, and others. In one example aspect, a mathematically powerful error correction code is disclosed, along with its encoding and decoding implementations. The code uses non-binary symbols and achieves very high degree of reliability without causing significant increase in computational complexity. The use of such codes, along with recently developed OTFS modulation technique, is expected to meet the stringent reliability and other operational needs of next generation wireless networks.

To explain the disclosed subject matter, a brief introduction to OTFS modulation is first provided, followed by various embodiments of the error coding technology disclosed herein.

1 Overview of OTFS Modulated Systems

OTFS modulation has numerous benefits that tie into the challenges that 5G systems are trying to overcome. Arguably, the biggest benefit and the main reason to study this modulation is its ability to communicate over a channel that randomly fades within the time-frequency frame and still provide a stationary, deterministic and non-fading channel interaction between the transmitter and the receiver. As will be seen, in the OTFS domain all information symbols experience the same channel and the same SNR, e.g., there is no concept of time-selective or frequency-selective fading.

Further, OTFS best utilizes the fades and power fluctuations in the received signal to maximize capacity. To illustrate this point, assume that the channel consists of two reflectors which introduce peaks and valleys in the channel response either across time or across frequency or both. An OFDM system can theoretically address this problem by allocating power resources according to the waterfilling principle. However, due to practical difficulties such approaches are not pursued in wireless OFDM systems, leading to wasteful parts of the time-frequency frame having excess received energy, followed by other parts with too low received energy. An OTFS system resolves the two reflectors and the receiver equalizer coherently combines the energy of the two reflectors, providing a non-fading channel with the same SNR for each symbol. It therefore provides a channel interaction that is designed to maximize capacity under the transmit assumption of equal power allocation across symbols (which is common in existing wireless systems), using only standard AWGN codes.

In addition, OTFS operates in a domain in which the channel can be characterized in a very compact form. This has significant implications for addressing the channel estimation bottlenecks that plague current multi-antenna systems and can be a key enabling technology for addressing similar problems in future massive MIMO systems. One key benefit of OTFS is its ability to easily handle extreme Doppler channels. This is not only useful in vehicle-to-vehicle, high speed train and other 5G applications that are Doppler intensive, but can also be an enabling technology for mm-Wave systems where Doppler effects will be significantly amplified.

Further, as will be seen, OTFS provides a natural way to deliver massive processing gain, and two dimensional CDMA random access to multicarrier systems. The processing gain can address the challenge of deep building penetration needed for IoT applications, while the CDMA multiple access scheme can address the battery life challenges and short burst efficiency needed for IOT deployments.

Last but not least, the compact channel estimation process that OTFS provides can be essential to the successful deployment of advanced technologies like Cooperative Multipoint (Co-MP) and distributed interference mitigation or network MIMO.

1.1 Example Principles of OTFS Modulation

OTFS works in the Delay-Doppler coordinate system using a set of basis functions orthogonal to both time and frequency shifts. FIG. 1 illustrates the modulation and demodulation steps. The transmit information symbols (QAM symbols) are placed on a lattice or grid in the 2-dimensional Delay-Doppler domain, as opposed to the more familiar Time-Frequency domain, where OFDM, TDMA and CDMA information symbols would be placed. A two dimensional OTFS transform (similar to a 2D FFT) translates the QAM symbols from the Delay-Doppler domain into the Time-Frequency domain.

Through this transform, each QAM symbol is spread throughout the Time-Frequency plane (e.g., across the full signal bandwidth and symbol time) utilizing a different basis function. As a result, all symbols have the same SNR and experience exactly the same channel. The implication is that there is no frequency or time selective fading of QAM symbols, in contrast with existing modulations such as OFDM or TDMA. Since FEC is not required to counter this frequency or time selective fading impact, the full power of the code can be applied to the non-faded signal.

After the 2D OTFS transform, the signal is now spread throughout the Time-Frequency plane. In fact, the transform results in a doubly periodic extension that extends throughout frequency and time. This signal is be windowed, as will be explained below. The resulting transformed and windowed signal lies in the same domain as the familiar OFDM symbols. The OTFS signal then follows the same data path as an OFDM symbol, namely through a transmit filter bank. At the receive side, the inverse processing is performed. Note that in OFDM the transmit and receive symbols in the Time-Frequency domain are related through the multiplicative channel H(f, t), whereas in OTFS the transmit and receive symbols in the Delay-Doppler domain are related through the convolutive channel her, v).

1.2 Examples of the OTFS Lattice

Figure 2:
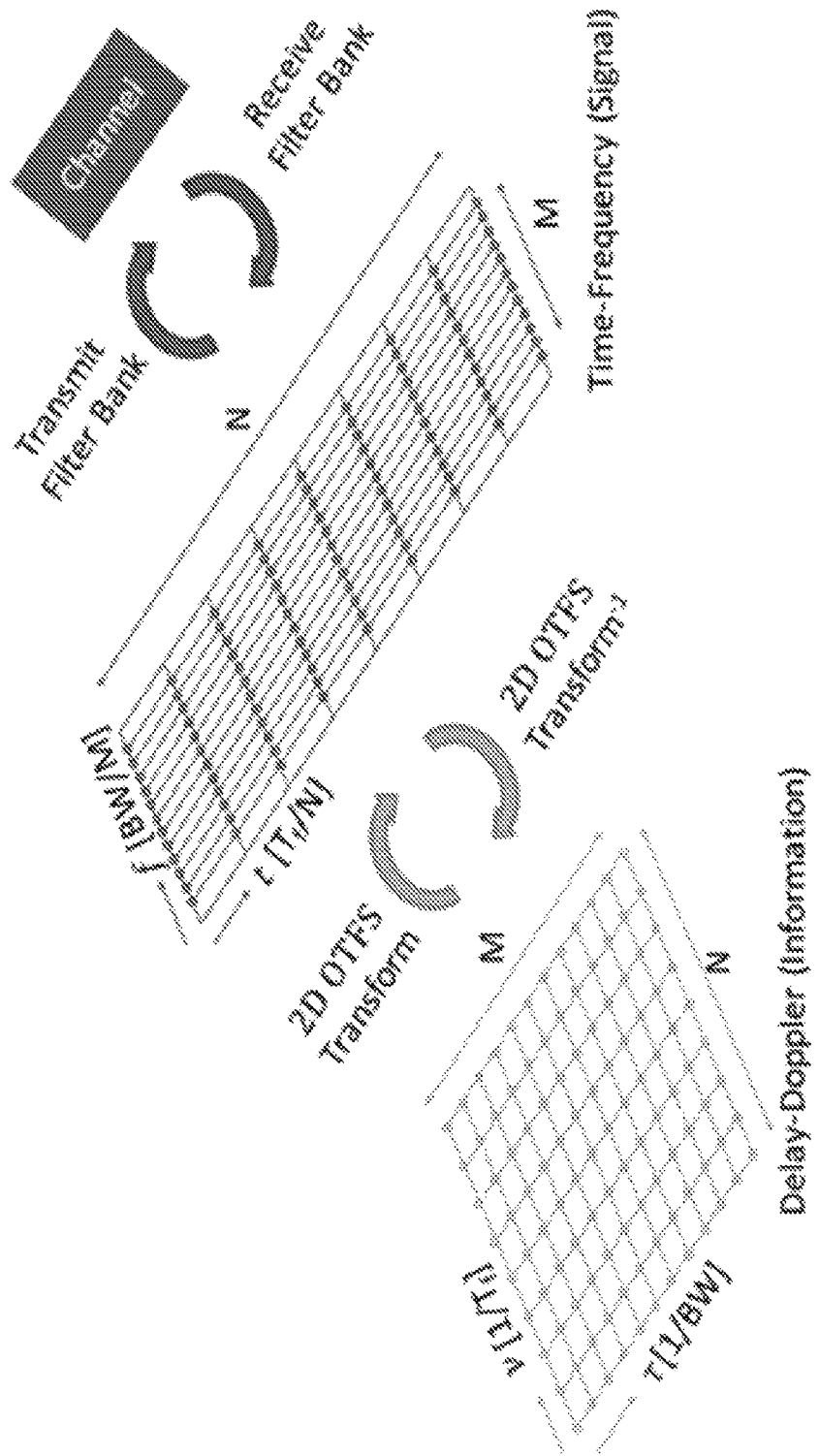
FIG. 2 shows an example of a transformation using the OTFS lattice.

An alternate illustration of this construction is shown in FIG. 2. In this figure the OTFS QAM symbols reside on a grid or lattice of size N×M. The OTFS transform translates these QAM symbols to a lattice in the Time-Frequency plane of size M×N (note the swapping of axes a result of the OTFS transform, as will be explained below). The OTFS Delay-Doppler lattice and the Time-Frequency multi-carrier lattice are related through a mathematical reciprocity relation intimately linked with the symplectic Fourier transform. In this Time-Frequency domain, one can think of the points along the frequency axis as the equivalent of an OFDM symbol, made up of M subcarriers. In the time dimension, we have the equivalent of N OFDM symbols, where N is a design parameter related to the Doppler spread of the channel.

Another observation worth noting in FIG. 2 is the fine resolution of the Delay-Doppler lattice. In the Delay-Doppler coordinate system, the delay or multipath resolution is given by the inverse of the bandwidth and the Doppler resolution is given by the inverse of the OTFS symbol time or observation time.

To summarize, in OTFS information symbols are indexed by points on a lattice or grid in the Delay-Doppler domain. Through the OTFS Transform each QAM symbol weights a 2D basis function defined in the Time-Frequency domain. The frequency domain samples at each time are transformed into time domain waveforms using filter banks.

1.3 the OTFS Information Domain

Figure 3A:
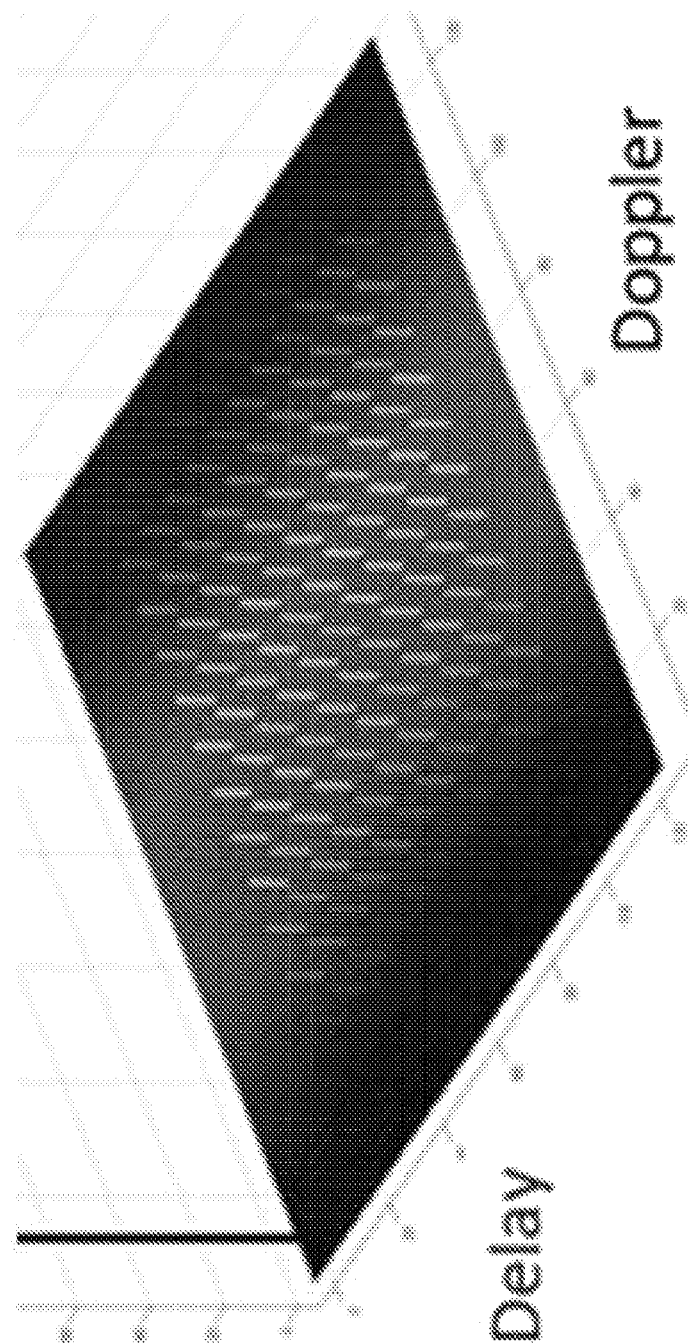
FIGS. 3A and 3B show an example of the OTFS information domain and a received OTFS symbol, respectively.

In OTFS, the information QAM symbols are arranged over an N×M grid on the Delay-Doppler plane, as shown in FIG. 3A. One pilot substitutes one of the information QAM symbols for channel sounding and acquisition. The pilot power can be boosted since the energy of all symbols is spread evenly throughout the Time-Frequency domain. An unused rectangle surrounds the pilot to allow for interference-free channel estimation at the receiver. For multiple streams/antennas, additional pilots would be inserted along the empty strip shown on the top part of the figure.

1.4 Examples of Channel Estimation

Figure 3B:
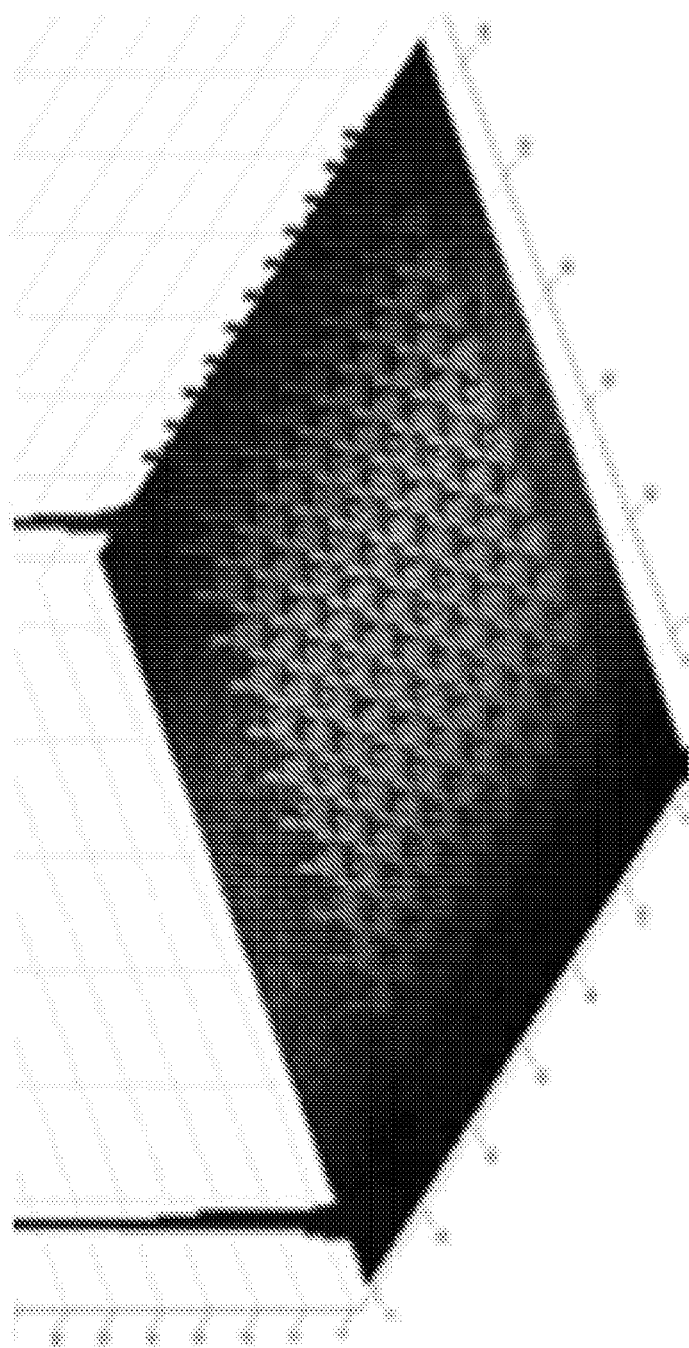

After transmission and demodulation, the received OTFS symbols are given by the two dimensional convolution of the transmitted QAM symbols above with the Delay-Doppler channel. The result is shown in FIG. 3B. As seen therein, the Delay-Doppler impulse response estimate is given by the region surrounding the received pilot. By extracting this region, a concise and accurate estimate of the Delay-Doppler impulse response may be obtained. In some embodiments, a 2D equalizer is used to remove the convolutive interaction of the channel with the transmitted QAM symbols. Standard equalization techniques can be used, extended to two dimensions.

1.5 Examples of the 2D OTFS Transform

Figure 4:
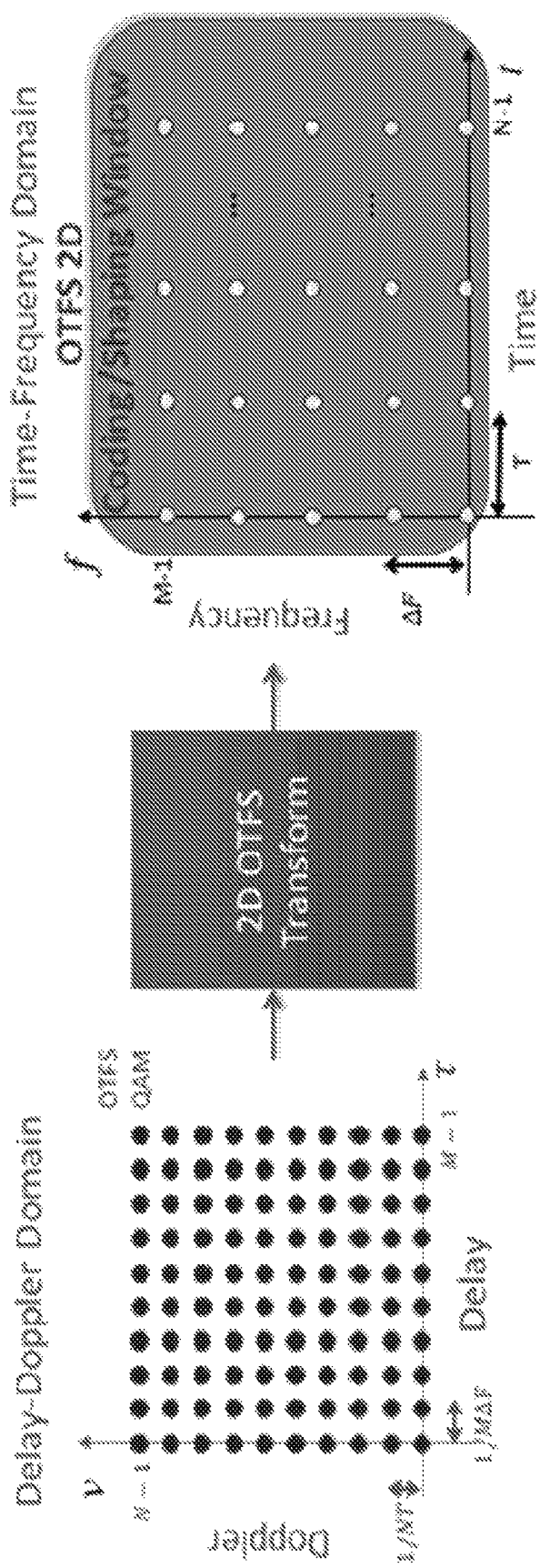
FIG. 4 shows an example of a two-dimensional (2D) OTFS transform from the delay-Doppler domain to the time-frequency domain.

The various components of OTFS modulation include the 2D OTFS transform, as shown in FIG. 4. OTFS QAM symbols are defined over a grid in the Delay-Doppler domain. As described previously, the 2D OTFS transform translates every point on this Delay-Doppler plane into a corresponding basis function that covers the entire Time-Frequency plane. Thus OTFS QAM symbols are transformed onto a grid representing sample points in the Time-Frequency domain and the energy of each QAM symbol is spread over the Time-Frequency domain. Recall that this is the same grid over which OFDM QAM symbols (or any of its filtered multi-carrier variants) are defined.

1.5.1 the Symplectic Finite Fourier Transform

The first step in the modulation of the QAM symbols is the 2D OTFS transform. This is given by a variant of the 2D FFT called the Symplectic Finite Fourier Transform (SFFT), defined as $$X(k, l) = SFFT\{x(m, n)\}$$
$$= \sum_{m=0}^{M-1} \sum_{n=0}^{N-1} x(m, n) b_{m,n}(k, l)$$
$$b_{m,n}(k, l) = e^{-j2\pi\left(\frac{lm}{M} - \frac{kn}{N}\right)}$$

Where $x(m, n)$ are the QAM symbols in the Delay-Doppler domain, $b_{m,n}(k, l)$ are the basis functions associated with the [m, n]th QAM symbol in the Time-Frequency domain (with time and frequency indexed by k and l, respectively), and M and N are the number of points in the Delay and Doppler dimensions, respectively. Alternatively, M is equivalent to the number of subcarriers and N to the number of multi-carrier symbols. Notice that the Symplectic Fourier Transform differs from the more well-known Cartesian Fourier Transform in that the exponential functions across each of the two dimensions have opposing signs and the coordinates are flipped in the two domains. This is necessary as it matches the behavior of the Delay-Doppler channel representation relative to the time-varying frequency response representation of the channel.

Figure 5:
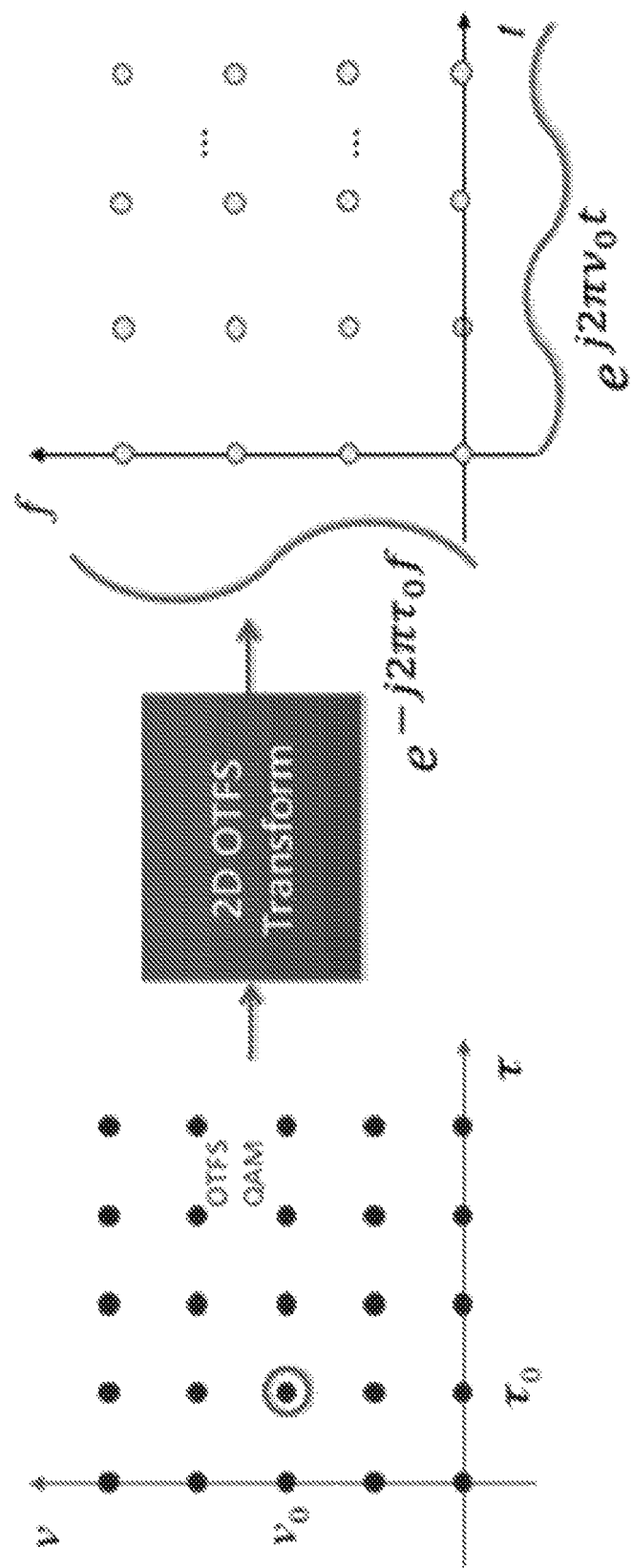
FIG. 5 shows an example of the 2D OTFS transform to a basis function.

To visualize the 2D basis functions, consider the continuous time representations of the Delay-Doppler and Time-Frequency domains. In FIG. 5, a point in the Delay-Doppler domain on the left, indexed by $[\tau_0, v_0]$ is transformed to a multiplication of two linear phases in the Time-Frequency domain on the right, where the frequency of the exponential in the 'time' dimension is given by the Doppler index, $v_0$, and the frequency of the exponential in the 'frequency' dimension is given by the Delay index, $\tau_0$.

To summarize the initial step in the modulation process:
- QAM symbols are placed on a grid in the Delay-Doppler domain.
- Through the Symplectic Fourier Transform, each QAM symbol multiplies a 2D basis function defined in the Time-Frequency domain.
- The Time-Frequency signal is a superposition of multiple QAM symbols weighting the 2D basis functions.
- The energy of each symbol is spread across the signal bandwidth and OTFS symbol time.

At the receiver, the corresponding final demodulation step is the Inverse Symplectic Finite Fourier Transform, given by $$x(m, n) = \sum_{l=0}^{M-1} \sum_{k=0}^{N-1} X(k, l) b^*_{m,n}(k, l)$$
$$b^*_{m,n}(k, l) = e^{j2\pi\left(\frac{lm}{M} - \frac{kn}{N}\right)}$$

1.5.2 Example of the OTFS Window

In some embodiments, the basis functions, $X(k, l)$ are doubly periodic with period [N, M], or equivalently, as seen in FIG. 6, they are defined on a torus discretely sampled with M and N points in each dimension. The basis functions extend infinitely in frequency and time and are thus windowed at the transmitter with a 2D shaping window, $W_{tr}[k, l]$, in order to restrict the available transmission bandwidth and time. This window multiplies the modulation symbols in the Time-Frequency domain. A trivial window example is the rectangular window $W_{tr}[k, l]=1$ for all k=0, ..., N−1, l=0, ..., M−1 and zero elsewhere. Since the signal in this domain is periodic, the window can be applied in any region of the domain without loss of information.

The signal in the Time-Frequency domain is thus given by $$\Theta(k,l)=W_{tr}[k,l] \cdot SFFT\{x(m,n)\}$$

The window in general could extend beyond the period of the information symbols [N, M] and could have a shape different from a rectangular pulse. This would be akin to adding cyclic prefix/suffix in the dimensions of both time and frequency with or without shaping. The choice of window has implications on the shape and resolution of the channel response in the information domain. In some embodiments, the OTFS window also enables the multiplexing of traffic to or from multiple users.

2 Examples of NB-LDPC Codes in OTFS Systems

In some digital communication systems, low density parity check (LDPC) error correction is used. While "textbook" LDPC can provide good performance that is close to the well-known Shannon limit, for practical reasons, real implementations often use sub-optimal LDPC such as repeat-accumulate techniques for implementing LDPC. As a result, the error floor seen in these implementations is of the order of $10^{-5}$ to $10^{-6}$. In applications that require better performance, an outer code such as ReeD Solomon code or BCH code is used. The use of outer code increases the complexity and latency of an implementation.

The non-binary LDPC codes described in the present document can be used in embodiments in which an extremely low error floor ($10^{-11}$ or $10^{-12}$) can be achieved. Due to the formulation of an H matrix that includes non-binary entries, as further described herein, the H matrix provides better permutations, thereby lessening error triggering events, thus resulting in superior performance.

In addition, the disclosed non-binary LDPC codes are especially useful in orthogonal time frequency space (OTFS) modulation based communication systems. Certain error correction codes such as LDPC are known to provide better results on AWGN channels (as compared to fading channels). Due to the property that a symbol in OTFS is spread over the entire channel spectrum, the impairment due to channel is averaged and the resulting error statistics looks more like AWGN, thus making LDPC implementations particularly suitable for OTFS modulation.

Figure 7:
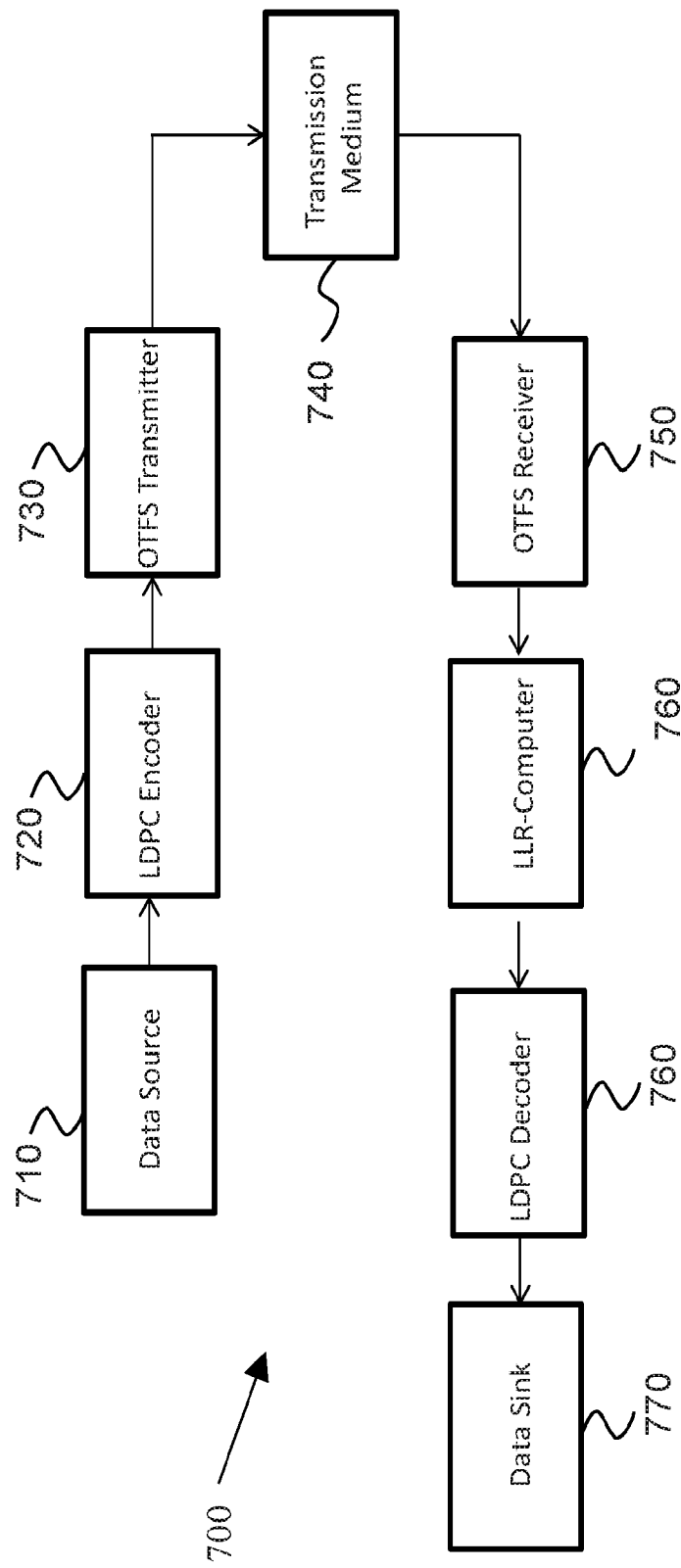
FIG. 7 shows an exemplary system that uses the NB-LDPC code.

FIG. 7 depicts an example of a system 700 utilizing a non-binary LDPC code, in accordance with some example embodiments. The system 700 includes data source 710 which can include a data source to be sent over a wired or wireless radio frequency or optical communications system, or data associated with a device such as a disk drive. In the example of a disk drive, the data may include data to be written by a write head to cause magnetic changes on a magnetic disk. Data source 710 is provided to LDPC encoder 720. The LDPC encoder 720 includes the non-binary LDPC encoder. The encoded data from LDPC encoder 720 is provided to a transmitter including a modulator. For example, the encoded data may be provided to an orthogonal time frequency space (OTFS) modulator and transmitter 730. In another example, the encoded data may be provided to a magnetic write head of a disk drive. The transmitted signal (or signal written to disk) is passed over a transmission medium 740 which can include, for example, air for wireless RF or optical signals, wire, optical fiber, or other medium. Transmission medium 740 can also include a magnetic platter of a magnetic click drive. After passing through transmission medium 740, the signal is received. For example, an RF or optical signal may be received by OTFS receiver 750. In another example, the receiver may be a read head of a magnetic disk drive. After reception, the received signal may be passed through a log likelihood ratio computer 760, followed by a LDPC decoder (e.g., a non-binary LDPC decoder). After decoding, the data is provided to a data sink 770.

Exemplary embodiments of NB-LDPC codes in OTFS systems are described in the following subsections.

2.1 Terms and Definitions

Definition

Let $\mathbb{F}$ be a set of objects on which two operations '+' and 'x' are defined. $\mathbb{F}$ is said to be a field if and only if (iff):

1. $\mathbb{F}$ forms a commutative group under '+'. The additive identity element is '0'.

2. $\mathbb{F} \setminus \{0\}$—(read as: IF take away 0) (the set $\mathbb{F}$ with the additive identity removed) forms a commutative group under 'x'. The multiplicative identity element is '1'.

3. The operations '+' and 'x' distribute: a×(b+c)=(a×b)+(a×c).

A field can also be defined as a commutative ring with identity in which every element has a multiplicative inverse.

Example

Rational numbers form one of the 'infintite fields'.

Example

The real numbers form another infinite field, and so do the complex numbers.

Example

The integers do not form a field, for most of the integers do not have an integer multiplicative inverse.

Definition

Fields of finite order are known as Galois fields. A Galois field of order q is denoted as GF(q). Examples of GF(2) and GF(7) are given in Tables 2.1, 2.2, 2.3, and 2.4.

TABLE 2.2

$\mathbb{F}$ (2)-Multiplication

| × | 0 | 1 |
|---|---|---|
| 0 | 0 | 0 |
| 1 | 0 | 1 |

TABLE 2.1

$\mathbb{F}$ (2)-Addition

| + | 0 | 1 |
|---|---|---|
| 0 | 0 | 1 |
| 1 | 1 | 0 |

TABLE 2.3

$\mathbb{F}$ (7)-Addition

| + | 0 | 1 | 2 | 3 | 4 | 5 | 6 |
|---|---|---|---|---|---|---|---|
| 0 | 0 | 1 | 2 | 3 | 4 | 5 | 6 |
| 1 | 1 | 2 | 3 | 4 | 5 | 6 | 0 |
| 2 | 2 | 3 | 4 | 5 | 6 | 0 | 1 |
| 3 | 3 | 4 | 5 | 6 | 0 | 1 | 2 |
| 4 | 4 | 5 | 6 | 0 | 1 | 2 | 3 |
| 5 | 5 | 6 | 0 | 1 | 2 | 3 | 4 |
| 6 | 6 | 0 | 1 | 2 | 3 | 4 | 5 |

TABLE 2.4

$\mathbb{F}$ (7)-Multiplication

| + | 0 | 1 | 2 | 3 | 4 | 5 | 6 |
|---|---|---|---|---|---|---|---|
| 0 | 0 | 0 | 0 | 0 | 0 | 0 | 0 |
| 1 | 0 | 1 | 2 | 3 | 4 | 5 | 6 |
| 2 | 0 | 2 | 4 | 6 | 1 | 3 | 5 |
| 3 | 0 | 3 | 6 | 2 | 5 | 1 | 4 |
| 4 | 0 | 4 | 1 | 5 | 2 | 6 | 3 |
| 5 | 0 | 5 | 3 | 1 | 6 | 4 | 2 |
| 6 | 0 | 6 | 5 | 4 | 3 | 2 | 1 |

TABLE 2.5

| + | 0 | 1 | 2 | 3 |
|---|---|---|---|---|
| 0 | 0 | 1 | 2 | 3 |
| 1 | 1 | 0 | 3 | 2 |
| 2 | 2 | 3 | 0 | 1 |
| 3 | 3 | 2 | 1 | 0 |

TABLE 2.6

| × | 0 | 1 | 2 | 3 |
|---|---|---|---|---|
| 0 | 0 | 0 | 0 | 0 |
| 1 | 0 | 1 | 2 | 3 |
| 2 | 0 | 2 | 3 | 1 |
| 3 | 0 | 3 | 1 | 2 |

Example Tables 2.5 and 2.6 describe the '+' and 'x' operations of $\mathbb{F}(2^2)$. Since the rules of addition and multiplication are not straightforward, it is best to implement it in the hardware using two dimensional look up tables. In a simple implementations, two tables each of size $q^2$ would be required for this for this purpose. However, this memory requirement can be brought down to q.

Linear Block Codes.

A block error control code C consists of a set of M code words $\{c_0, c_1, c_2 \ldots, c_{M-1}\}$. Each code word is of the form $c_i = (c_0, c_1 \ldots c_{n-1})$; if the individual coordinates take on values from the Galois Field GF (q), then the code C is said to be q-ary. C is a q-ary linear code of length n iff C forms a vector sub space over the vector space V consisting of all n-tuples of GF (q).

Let $\{g_0, g_1, \ldots, g_{k-1}\}$ be a basis of the code words for the (n,k) q-ary code C. There exists a unique representation $c = a_0 g_0 + a_1 g_1 + \ldots + a_{k-1} g_{k-1}$ for every code word $c_i \in C$. Since every linear combination of the basis elements must also be a code word, there is a one-to-one mapping between the sets of k-symbols $(a_0, a_1, \ldots, a_{k-1})$ over GF (q) and the code words in C. A generator matrix G can be constructed by taking as its rows the vectors in the basis.

$$G = \begin{bmatrix} g_0 \\ g_1 \\ \vdots \\ g_{k-1} \end{bmatrix} = \begin{bmatrix} g_{0,0}, g_{0,1}, \ldots, g_{0,n-1} \\ g_{1,0}, g_{1,1}, \ldots, g_{1,n-1} \\ \vdots \\ g_{k-1,0}, g_{k-1,1}, \ldots, g_{k-1,n-1} \end{bmatrix} \quad \text{(Equation 2.1)}$$

G can be used to directly encode k-symbol data blocks in the following manner. Let $m = (m_0, m_1, \ldots, m_{k-1})$ be a q-ary block of un-coded data.

$$mG = (m_0, m_1, \ldots, m_{k-1}) \begin{bmatrix} g_0 \\ g_1 \\ \vdots \\ g_{k-1} \end{bmatrix} = m_0 g_0 + m_1 g_1 + \ldots, \quad \text{(Equation 2.2)}$$

$$m_{k-1} g_{k-1} += c$$

As discussed, a q-ary code C of length n forms a vector sub space of dimension k, within the vector space V of all n-tuples over GF(q). Given this, we can talk about the dual space of C within V. Two sub spaces, S and Si of the vector space V are dual to each other if for all a∈S and b∈S$^\perp$, a.b=0. The dual space of a linear code is called the dual code of C. It is denoted by C$^\perp$. It is a vector space of dimension n-k. It follows that a basis $\{h_0, h_1, \ldots, h_{k-1}\}$ for C$^\perp$ can be found. This is used to construct a parity-check matrix H.

$$H = \begin{bmatrix} h_0 \\ h_1 \\ \vdots \\ h_{k-1} \end{bmatrix} = \begin{bmatrix} h_{0,0}, h_{0,1}, \ldots, h_{0,n-1} \\ h_{1,0}, h_{1,1}, \ldots, h_{1,n-1} \\ \vdots \\ h_{k-1,0}, h_{k-1,1}, \ldots, h_{k-1,n-1} \end{bmatrix} \quad \text{(Equation 2.3)}$$

For every c∈C, $cH^T=0$. Similarly if $cH^T=0$, c is a code word. It follows that $GH^T=0$.

Using Gaussian elimination and column reordering on a linear code C with a generator matrix G, it is always possible to obtain a generator matrix of the form in Eq. 2.4.

$$G = [I_k | P_{n-k}] = \quad \text{(Equation 2.4)}$$

$$\begin{bmatrix} 1, 0, \ldots, 0 | p_{0,0}, p_{0,1}, \ldots, p_{0,n-k-1} \\ 0, 1, \ldots, 0 | p_{1,0}, p_{1,1}, \ldots, p_{1,n-k-1} \\ \vdots \\ 0, 0, \ldots, 1 | p_{k-1,0}, p_{k-1,1}, \ldots, p_{k-1,n-k-1} \end{bmatrix}$$

When a data block is encoded using G, the data block is embedded without modification in the first k coordinates of the resulting code word. This is called systematic encoding.

$$c = mG \quad \text{(Equation 2.5)}$$
$$= [m_0, m_1, \ldots, m_{k-1}][I_k | P]$$
$$= [m_0, m_1, \ldots, m_{k-1}, c_0, c_1, \ldots, c_{n-k-1}]$$

After decoding, the first k symbols are removed from the selected code word and passed along to the data sink.

Given a systematic generator matrix of the form Eq. 2.4, a corresponding parity check matrix can be obtained as:

$$H = [-P^T | I_{n-k}] = \begin{bmatrix} -p_{0,0}, -p_{0,1}, \ldots, -p_{k-1,0} | 1, 0, \ldots, 0 \\ -p_{0,1}, -p_{1,1}, \ldots, -p_{k-1,1} | 0, 1, \ldots, 0 \\ \vdots \\ -p_{0,n-k-1}, -p_{1,n-k-1}, \ldots, \\ -p_{k-1,n-k-1} | 0, 0, \ldots, 1 \end{bmatrix}$$ (Equation 2.6)

Circulant Matrix:

An n×n circulant matrix C takes the form:

$$C = \begin{bmatrix} c_0 & c_{n-1} & \ldots & c_2 & c_1 \\ c_1 & c_0 & c_{n-1} & & c_2 \\ \vdots & c_1 & c_0 & \ddots & \vdots \\ c_{n-2} & & \ddots & \ddots & c_{n-1} \\ c_{n-1} & c_{n-2} & \ldots & c_1 & c_0 \end{bmatrix}$$ (Equation 2.7)

A circulant matrix is fully specified by one vector, c, which appears as the first column of C. The remaining columns of C are each cyclic permutations of the vector c with offset equal to the column index. The last row of C is the vector c in reverse order, and the remaining rows are each cyclic permutations of the last row. In the context of non-binary LDPC codes, a typical circulant matrix will have the following form:

$$C = \begin{bmatrix} c1 & 0 & \ldots & 0 & 0 \\ 0 & c2 & \ldots & 0 & \\ \vdots & 0 & c3 & \ddots & \vdots \\ 0 & & \ddots & \ddots & 0 \\ 0 & 0 & \ldots & 0 & cn \end{bmatrix}.$$ (Equation 2.8)

Permutation Matrix:

The permutation matrix $P_\pi$ corresponding to the permutation:

$$\pi = \begin{pmatrix} 1 & 2 & 3 & 4 & 5 \\ 1 & 4 & 2 & 5 & 3 \end{pmatrix}, \text{ is,}$$ (Equation 2.9)

$$P_\pi = \begin{bmatrix} e_{\pi(1)} \\ e_{\pi(2)} \\ e_{\pi(3)} \\ e_{\pi(4)} \\ e_{\pi(5)} \end{bmatrix} = \begin{bmatrix} e_1 \\ e_4 \\ e_2 \\ e_5 \\ e_3 \end{bmatrix} = \begin{bmatrix} 1 & 0 & 0 & 0 & 0 \\ 0 & 0 & 0 & 1 & 0 \\ 0 & 1 & 0 & 0 & 0 \\ 0 & 0 & 0 & 0 & 1 \\ 0 & 0 & 1 & 0 & 0 \end{bmatrix}.$$ (Equation 2.10)

In the context of non-binary LDPC codes, the non-zero elements can, in general, be different.

2.2 Quasi-Cyclic Codes

Let b, k, and t be positive integers such that k<tb. A (tb,k) linear code $C_{qc}$ over $GF(2^m)$ is called a quasi-cyclic code when: 1) Each code word in $C_{qc}$ consists of t sections of b bits each; and 2) every t-sectioned cyclic-shift of a codeword in $C_{qc}$ is also a codeword in $C_{qc}$. Such a QC code is called a t-section QC code.

Regular Codes:

If the number of non-zero elements in each column of the H matrix is same, we call it a regular code. On the other hand, if the weights of the columns differ, then its called irregular code.

2.3 A Priori, A Posteriori, and Extrinsic Probabilities

There are several types of probabilities that can be associated with a random variable, x. For the event {x=$a_k$}, suppose that E is an event whose effect on the variable x is under question. The prior probability refers to the probability P (x=$a_k$) that the variable x takes the value $a_k$. It is also known as the intrinsic probability. The prior/intrinsic probability for the variable x with respect to the event E is denoted as $P_E^{int}(x=a)=P(x=a)$. The posterior (a posteriori) probability is the conditional probability for random variable x with respect to event E is denoted as $Pr_E^{post}(x=a)=P(x=a|E)$. The intrinsic and posterior probabilities represent the probability before and after taking into account the event E. Using Bayes' rule, the posterior probability can be written as:

$$\underset{P(x=a|E)}{\text{posterior}} = \frac{1}{P(E)} \underset{P(E|x=a)}{\text{prop. to extrinsic}} \underset{P(x=a)}{\text{intrinsic}}$$ (Equation 2.11)

The term P(x=a) is the intrinsic probability; the term P(E|x=a) is proportional to the 'extrinsic' probability, which is the probability that describes the new information for x that has been obtained from the event E. The extrinsic probability for x with respect to E is defined by, $p_E^{ext}(x=a)=c'_x P(E|x=a)$ where c' is the normalization constant.

These terms will come up again when we discuss the messages passed in the sum-product algorithm.

2.4 Graphical Representation of LDPC Codes

Figure 8:
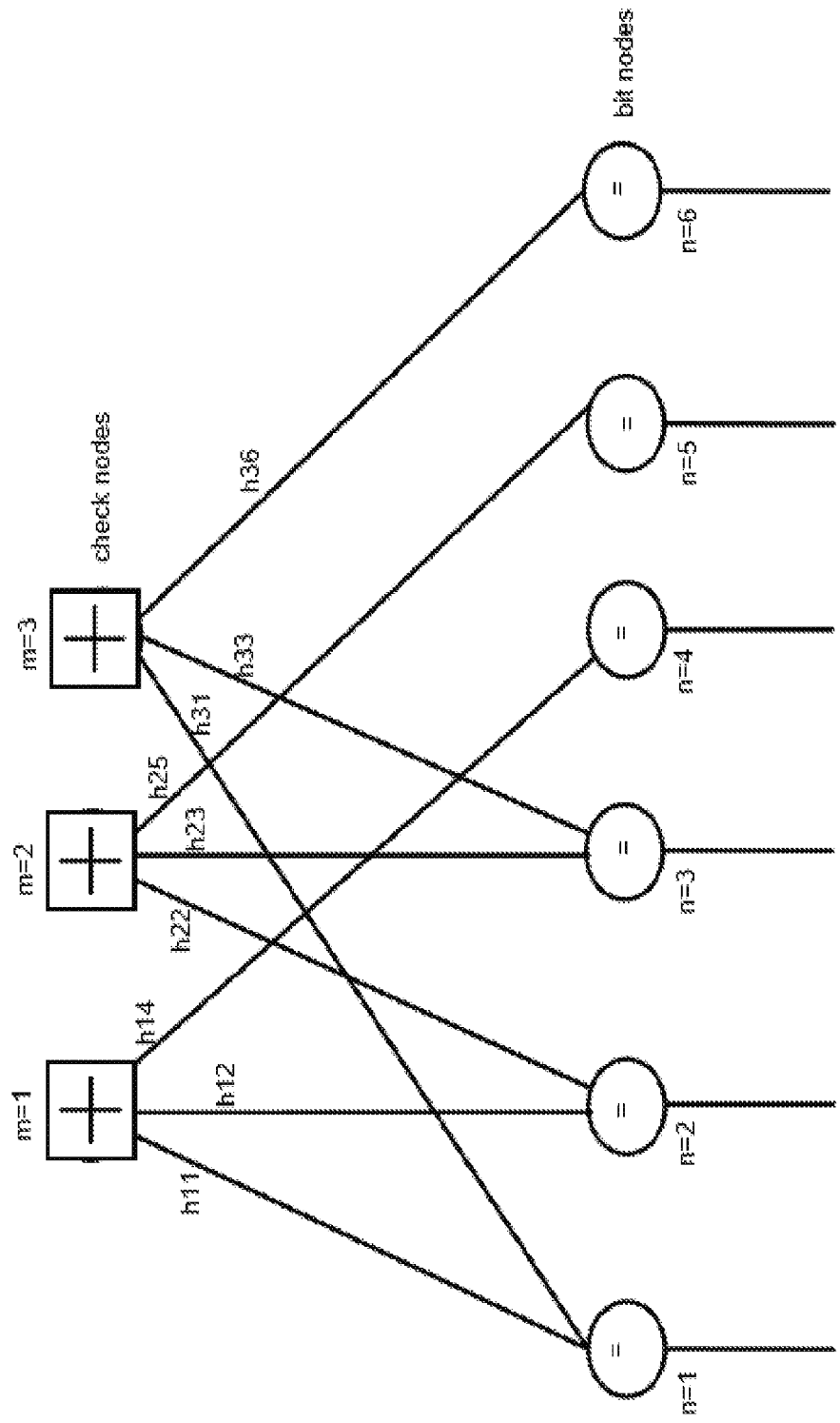
FIG. 8 shows an example Tanner graph for an LDPC code.

Block codes, such as LDPC codes, can be represented using bipartite graphs known as Tanner Graphs. This is best illustrated with an example. The Tanner graph for the parity check matrix H in (Equation 2.12) is shown in FIG. 8. There are N=6 variable nodes (circles), where each one corresponds to a different column of H or a different symbol in the code word. There are M=3 check nodes (squares) in the graph, where each corresponds to a different row in H or a different parity check equation.

$$H = \begin{pmatrix} h_{11} & h_{12} & 0 & h_{14} & 0 & 0 \\ 0 & h_{22} & h_{23} & 0 & h_{25} & 0 \\ h_{31} & 0 & h_{33} & 0 & 0 & h_{36} \end{pmatrix}$$ (Equation 2.12)

The reliability of each variable node (the variable node's belief that it takes on each of its possible values, which is a conditional probability distribution or LLR) is initialized from the received symbols (after equalization, so it is assumed that soft information about each variable is an independent piece of information). In the sum-product algorithm (SPA), or message passing algorithm, this reliability information is refined by being passed back and forth between variable nodes and check (constraint) nodes iteratively. In each iteration, the information (hopefully) becomes more reliable.

The a priori, or intrinsic, information associated with a node is the information known about it before the decoding starts. For a variable node, this is the information from the received symbols from the channel. The extrinsic information associated with a node a is the information provided by the decoder except for the information provided by node a.

The a posteriori information for node a is all of the information provided by the decoder without removing the information provided by node a. This is the information that a variable node will use to make a final decision on its value.

2.5 NB-LDPC Code Construction and Encoding

Building a decoder for a generic LDPC code is not viable in hardware. It would require an enormous amount of wiring and silicon. For this reason, commercial LDPC implementations use a special class of codes known as Quasi Cyclic (QC) LDPC codes. Decoder architecture for QC binary and non-binary (NB) codes are simple to implement. QC-binary systematic encoders can be implemented using simple shift-registers with linear complexity owing to a QC-Generator matrix. However, a QC-non-binary encoder does not entail, in general, a QC-G matrix and so would require quadratic complexity. However, for short/medium length codes, such as some of the example embodiments disclosed here, encoder complexity is not of prime concern currently.

Two examples of the disclosed subject matter include LDPC codes a) structured regular systematic repeat accumulate codes (RA codes) over the non-binary, structures $\mathbb{F}(q'')$ and b) codes that are created out of just permutation matrices. Code/H-matrix designs for a) are based on computer search whereas b) are based on analytic (Euclidean geometry) techniques. Both these methods are described in the sequel.

2.5.1 Design of Structured Regular Repeat Accumulate (RRA) Codes

Construction of a parity check matrix, H, for a non-binary RRA (regular repeat accumulate) code consists of two parts; 1) construct the binary-H matrix and 2) convert it to non-binary.

2.5.2 Construction of the Binary-H Matrix Based on Computer Search

Parity check matrix for RRA code is given by, $H=[H_1, H_2]$, where $H_1$ is the parity part and $H_2$ is the systematic part. Both $H_1$ and $H_2$ are composed of blocks of circulant permutation matrices and zero matrices of block size Q. There are Q different possibilities for each block/sub-matrix. Each block can be fully specified by an exponent that denotes the number of right shifts required for the non-zero element of the first row. For example, an exponent of 0 denotes an identity sub-matrix of size Q. The distinct exponents can thus be 0, 1 ... (Q−1). An all-zero block is denoted with an exponent of −1 (or 16, at times). The parity part, $H_1$, includes circulant permutation blocks while the systematic part, $H_2$ is square and double diagonal on the block level, meaning that each Q-sized block in $H_2$ consists of identity elements on its main and lower diagonal, and zero blocks elsewhere.

Henceforth the methodology by which $H_1$ can be constructed to contain no four-cycles in its Tanner graph is discussed. Four cycles can be formed either internal to $H_1$ or between $H_1$ and $H_2$. The method for reducing the amount of six-cycles is mentioned as well, although our application total removal of 6-cycles may not be feasible.

Let L be the number of Q-sized block rows and J be the number of block columns in $H_1$. From the definition of RRA, the number of block columns in $H_2$ is J. N, the number of columns in $[H_1, H_2]$ is N=+J) Q. A necessary and sufficient condition for removing 4-cycles for any configuration of rectangle abcd below (note that a,b,c,d are block circulant matrices as described previously) is given by $$\begin{pmatrix} \vdots & \vdots & \vdots \\ \ldots & a & \ldots & b & \ldots \\ \vdots & \ddots & \vdots \\ \ldots & c & \ldots & d & \ldots \\ \vdots & \vdots & \vdots \end{pmatrix} \quad \text{(Equation 3.1)}$$

$$a - c \neq b - d \pmod{Q}$$

Now offsetting column (a,c) by X and column (b,d) by Y (offsets are mod Q), as well as row (a,b) by D and row (c,d) by E. The transformation results in $a \mapsto a+X+D$ $c \mapsto c+X+E$ $b \mapsto b+Y+D$ $d \mapsto d+Y+E$ (Equation 3.2)

and the new equation is $(a+X+D)-(c+X+E) \neq (b+Y+D)-(d+Y+E) \Rightarrow (a+D)-(c+E) \neq (b+D)-(d+E) \Rightarrow a-c \neq b-d$ (Equation 3.3)

This shows that the rectangle rule is invariant under constant offsets to entire rows or columns. Therefore, without loss of generality, we can add offsets such that the first row and the first column consist of identity sub-matrices ('0' exponent blocks). By exploiting this property the search space for solutions is decreased. Having the first row and first column exponents as 0 implies that each row and each column must contain unique values least a 4-cycle be formed. Note that, a 6-cycle will be formed with the first row and column if a≡d (mod Q).

The algorithm used to design the H matrix works as follows: Let W be an array containing all ones, [1, 1 ... 1], of length Q. Let it denote the inclusion of numbers {0 ... (Q−1)} in a given set, say A. That is W=[1, 1, ... 1] implies A={0, 1, ... 15}. As another example, let W=[1, 0, 1, 1, 0, 1, 1, 1, 1, 1, 0, 0, 0, 1, 1, 1]. This implies that A={0, 2, 3, 5, 6, 7, 8, 9, 13, 14, 15}. Similarly for other values of W.

Recall that the first row and column of $H_1$ are preselected to have 0 exponents. Starting with index (2, 2) of $H_1$, and working row-wise (or column-wise, since the rules are invariant under transposition), solve for the set of possible exponent values for each index of $H_1$ that will form 4-cycles. This is done as follows: For each index, compare it with all slots with indexes less than its own, such that the current index is d and the one it is compared with is a, with b and c found to form the rectangle. Solve Equation 3.1 (recall a, b, c are known values) to find the value of d that will form a 4-cycle. Remove this value from A by suitably modifying W.

After this process, two situations may arise. Either there is at least one option for d, in which case pick one at random, or there are no options, in which case the run is aborted and the process must be restarted. If a matrix is successfully generated, it is passed into a function that runs a quick check to make sure that it indeed does pass the conditions for no 4-cycles, as well as counts the number of instances of a a≡d (mod Q) to get a metric for the amount of 6-cycles.

In some example embodiments, the following choices may be made: N=256, Q=16, and L=1 ... 8, J=15 ... 8. High rate codes, $$\left(R = \frac{J}{L+J}\right)$$

such as 15/16, 14/16 will have low number of layers (1 and 2). This is undesirable due to the low degree of $H_1$. This is especially so for 15/16 where the degree is equal to 1, rendering the code ineffective. Simulation results of these codes and ensuing discussions are detailed below.

Good high rate codes may be designed by increasing the number of layers. Since J must be increased by the same proportion as L to keep the rate fixed, N=(L+J) Q has to increase for a given constant value of Q. However, increasing N will cause greater latency and hardware resources. Since each row and column must contain unique values (prior to adding an offset of one to even rows), Q≥J is necessary to eliminate 4-cycles.

Relation between Code Rate (R), Number of Layers (L), sub-matrix Size (Q), Code Size (N) are depicted in Table 3.1.

TABLE 3.1

N for a choice of {L,R} for 4-cycle free H

| R \ L | 1 | 2 | 3 | 4 | 5 | 6 | 7 | 8 | 9 | 10 |
|---|---|---|---|---|---|---|---|---|---|---|
| 8/16 | 256⁻ | 256⁻ | 258⁻ | 256⁻ | 260⁻ | 264⁻ | 266⁻ | 256* | 270^ | 260^ |
| 9/16 | — | — | — | — | — | — | 256* | — | — | — |
| 10/16 | — | — | 256⁻ | — | — | 256* | — | — | 384* | — |
| 11/16 | — | — | — | — | 256* | — | — | — | — | 736 |
| 12/16 | 256⁻ | 256⁻ | 264⁻ | 256* | 320^ | 456^ | 616^ | 800 | 1008 | 1240 |
| 13/16 | — | — | 256* | — | — | 864 | — | — | 1920 | — |
| 14/16 | 256⁻ | 256* | 528^ | 928 | 1440 | 2064 | 2800 | 3648 | 4608 | 5680 |
| 15/16 | 256* | 992 | 2208 | 3904 | 6080 | 8736 | 11872 | 15488 | 19584 | 24160 |

Wherever there are no entries in Table 3.1, it implies that there is no solution existing using this algorithm. For example, for a 9/16 code, the only possible value of N is 256 and so on. Entries in the table with * indicates example embodiments. Entries with ~ indicates there are better alternative parameters possible for the given value of N. Entries with ^ denote 256≤N≤640.

As can be seen in Table 3.1, there is no solution for R=15/16, L>1, N≤640. Only one possible other option exists for R=14/16, none other exist for R=13/16 and several possibilities exist for R=12/16.

2.5.3 Conversion of Binary-H Matrix to Non-Binary H.

Currently the elements in a sub-matrix are chosen at random. However, this has to be changed to maximize the entropy. This is done as follows: Say we have a code that has M=N−K=16. We have 16 entries in the syndrome vector. Consider the 1st entry; by maximizing the entropy of the bit/symbol at that location.

Figure 9:
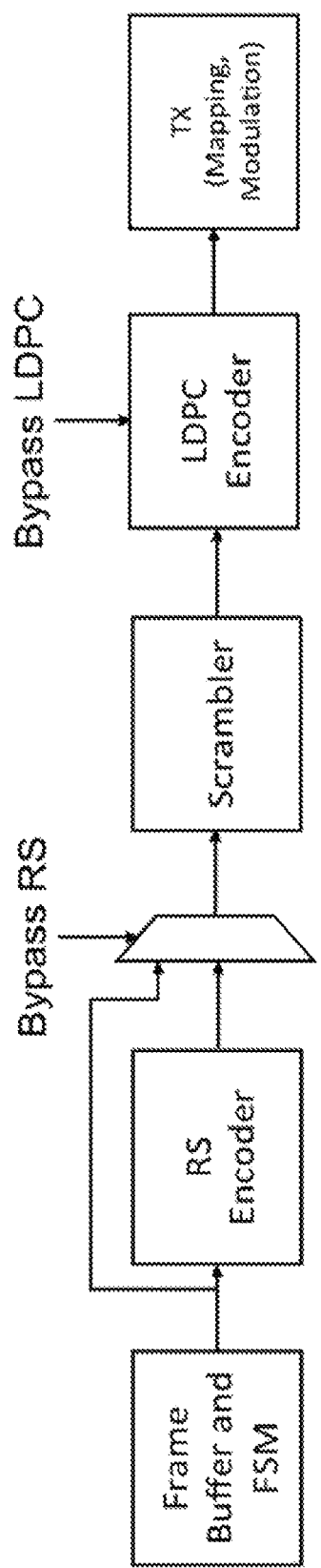
FIG. 9 shows an example of an LDPC encoder within a transmit chain.

The LDPC encoder belongs to the transmit chain, and it sits between the scrambler and the data/symbol mapper, as shown in FIG. 9. The LDPC encoder always gets its input data from the scrambler, even if the RS encoder is bypassed. The LDPC encoder may be bypassed if only the RS code is being used, and the LDPC encoder handles this case internally.

The LDPC encoder encodes the output of the scrambler whether or not the RS code is not being used. It takes a k-symbol message vector and encodes it into an n-symbol codeword vector (n>m). This adds structured redundancy that the LDPC decoder can exploit to correct errors in the codeword caused by the channel. For this reason, the encoder comes before the data is mapped to constellation symbols and modulated 2.6 Example Architectures for Non-Binary LDPC Codes The architecture must be able to implement any of the codes from the set {18/16, 9/16, 10/16, 11/16, 12/16, 13/16, 14/16, 15/16}. Switching between code rates should be able to happen from frame to frame. The encoder must support shortened codewords in the form of "zero stuffing" and must support zero padding.

Figure 10:
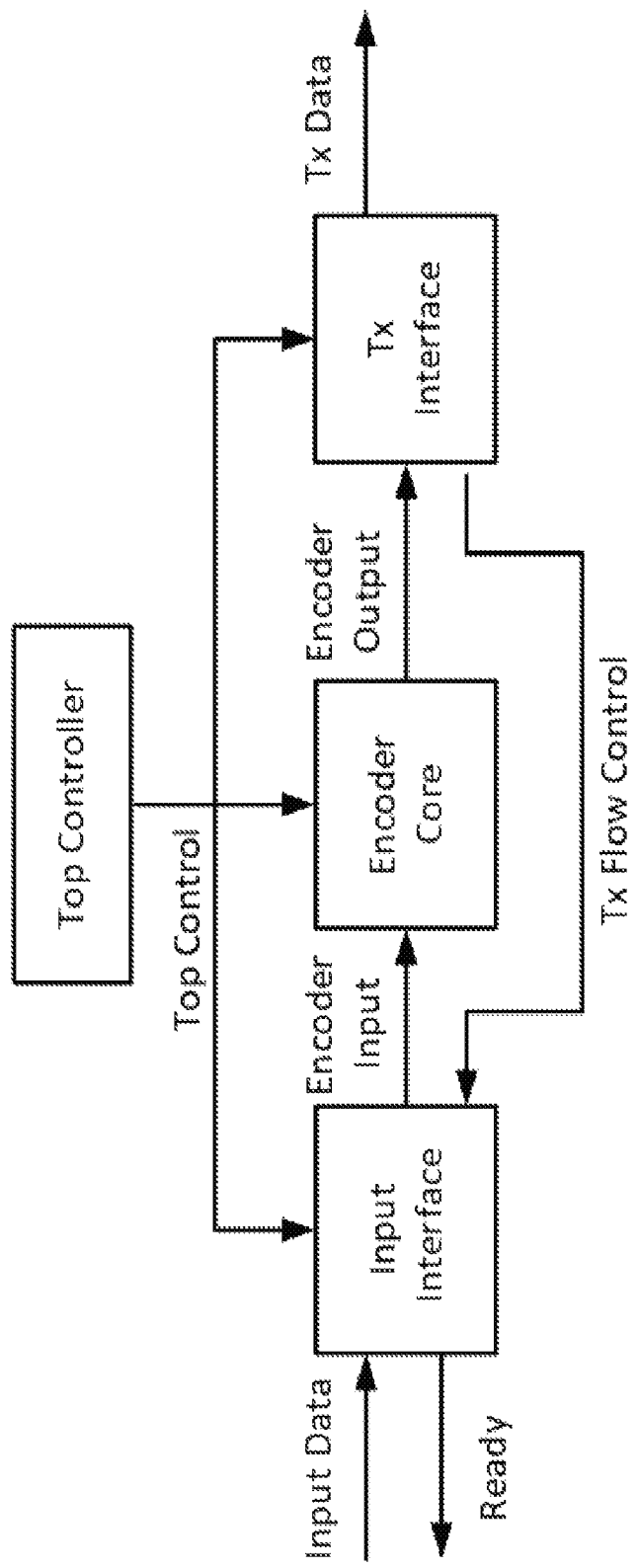
FIG. 10 shows an example of the overall architecture for the LDPC encoder.

At the top level, the LDPC encoder has four components: (1) the top controller, (2) the input interface to the scrambler, (3) the core, and (4) the Tx interface at the output. The signals and connections between the blocks are shown in FIG. 10.

The top controller controls switching between normal encoding operation, zero stuffing operation, and zero padding operation based on configuration registers that set the number of information bytes per frame, the number of zero to stuff/pad, and whether to stuff or pad if the number of zeros is larger than 0. It also controls the ready signal that goes to frame buffer FSM and times it so that the information symbols coming into the encoder pause at the correct time The input interface converts the 8-bit output from the scrambler to a 32-bit input for the LDPC encoder and pulses a valid signal when the 32-bits are ready. During the last codeword of the frame and if zero stuffing is enabled, zeros may be appended to the input in order to make up a full codeword. These zeros are not part of the information, so they must be removed before the codeword is written to the Tx FIFO in the output interface.

The core stores the information symbols from the input interface in a memory, encodes the information when enough information symbols have been stored (the number depends on the code rate), and outputs a 512-bit codeword 32-bits (16 symbols) at a time. It also raises a valid signal concurrently with each 32-bit codeword segment.

The Tx interface is an asynchronous FIFO that accepts a 32-bit input and a concurrent data valid signal and reads out between 2 and 10 valid bits depending on the current QAM constellation used by the modulator. During the last codeword and if zero stuffing is enabled, zeros added in the input interface must be removed.

2.6.1 Core Operation

Figure 11:
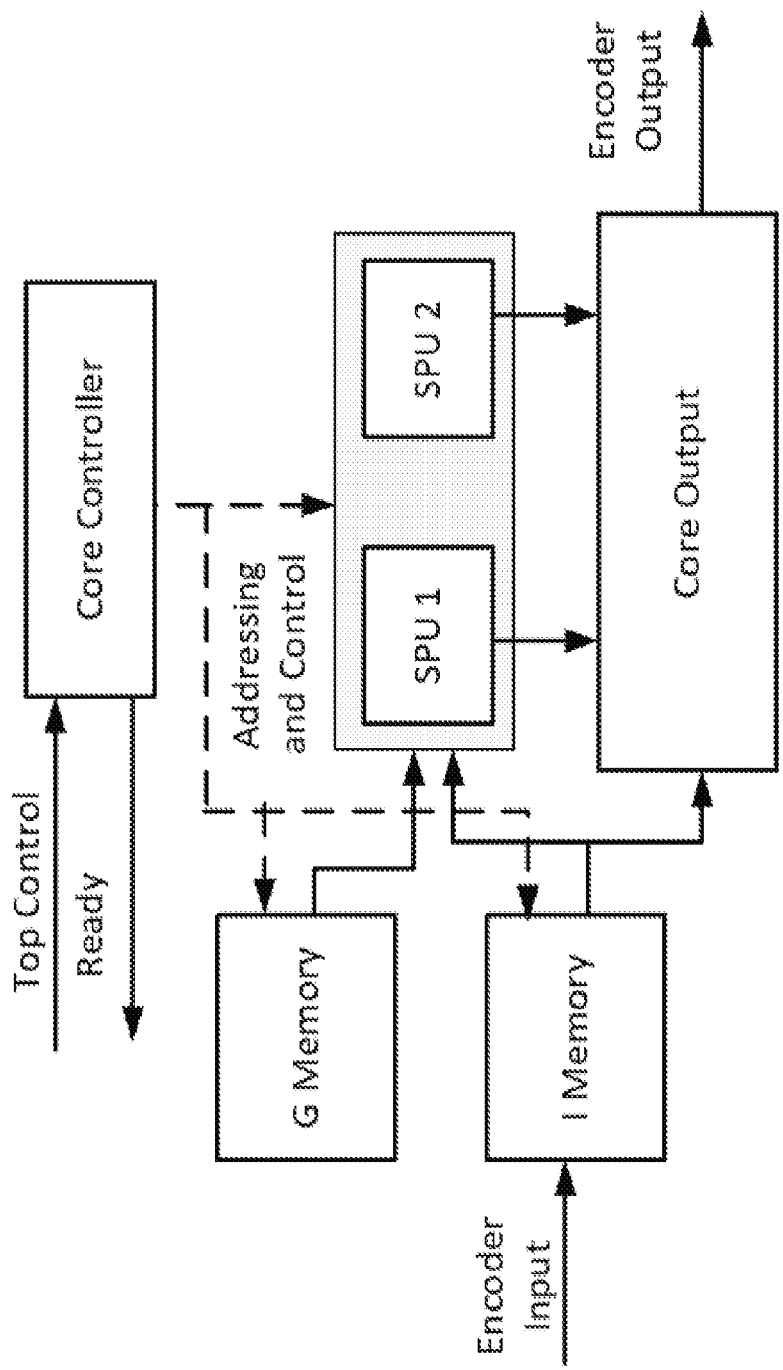
FIG. 11 shows an example of the LDPC encoder core architecture with signaling.

As shown in FIG. 11, the LDPC encoder core is broken up into five components: (1) the I memory, (2) the G memory, (3) the submatrix processing unit (SPU), (4) the read out registers, and (5) the core controller. The I memory holds the information symbols, the G memory holds the submatrices of the G matrix, and the SPU computes the matrix multiplication of a parity submatrix and the corresponding portion of the message vector. There are two SPUs that are resourceshared, but more could be added if necessary (e.g., if the codes change in the future). The choice for two SPUs is based on meeting the latency constraint.

The I memory is a ping-pong memory where the scrambler writes into one memory and the LDPC encoder reads from the other memory. The memory to write to and read from is controlled by the LDPC encoder's controller. The scrambler supplies the write data and data valid signals, and the LDPC encoder provides the write address, read address, and the memory select signals. The memory width is 32 because an entire submatrix's worth of information symbols is read out every cycle (z=16, and log 2(q)=2, so the total width is 32). The memory depth is 15 since the highest rate code has 15 block rows in its generator matrix. The other code rates will not use the full depth of the memory.

Figures 12A, 12B, 12C:
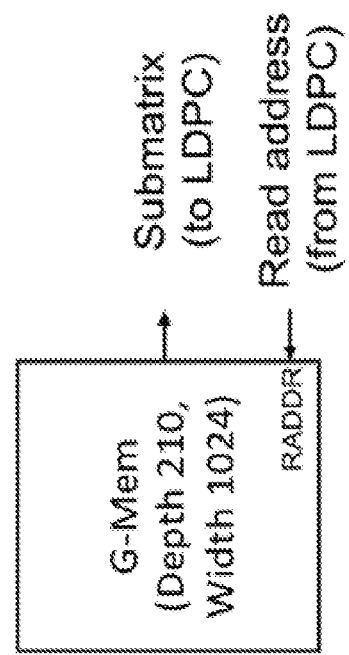
FIGS. 12A, 12B and 12C shows exemplary memory elements and mappings for a generator matrix associated with the LDPC code.

The G memory is a ROM that stores the submatrices for all G matrices (all code rates) so that it can switch between matrices quickly by just changing an offset to the read address that puts its first read at the desired matrix's first address (FIG. 12A). Each row of the G memory stores all elements corresponding to one submatrix of a G matrix, and the order that the submatrix is stored in the G memory is shown in FIG. 12B.

The width of the ROM is calculated as $n_{SPU} \cdot z^2 \cdot \log_2 q$, where $n_{SPU}$ is the number of SPUs in the architecture (here $n_{SPU}$=2, so the width is 1024). The depth is set as the sum of the depth required by each matrix and the depth of each matrix is the number of block rows in the matrix multiplied by the number of groups of block columns, which is the number of block columns in P divided by $n_{SPU}$ rounded up to the nearest integer (FIG. 12C). When $n_{SPU}$ does not divide the number of block columns in P, some SPUs will not produce a useful output because they are extra for that computation. In that case, the G memory entries for those block columns are set to all zeros.

Figure 13:
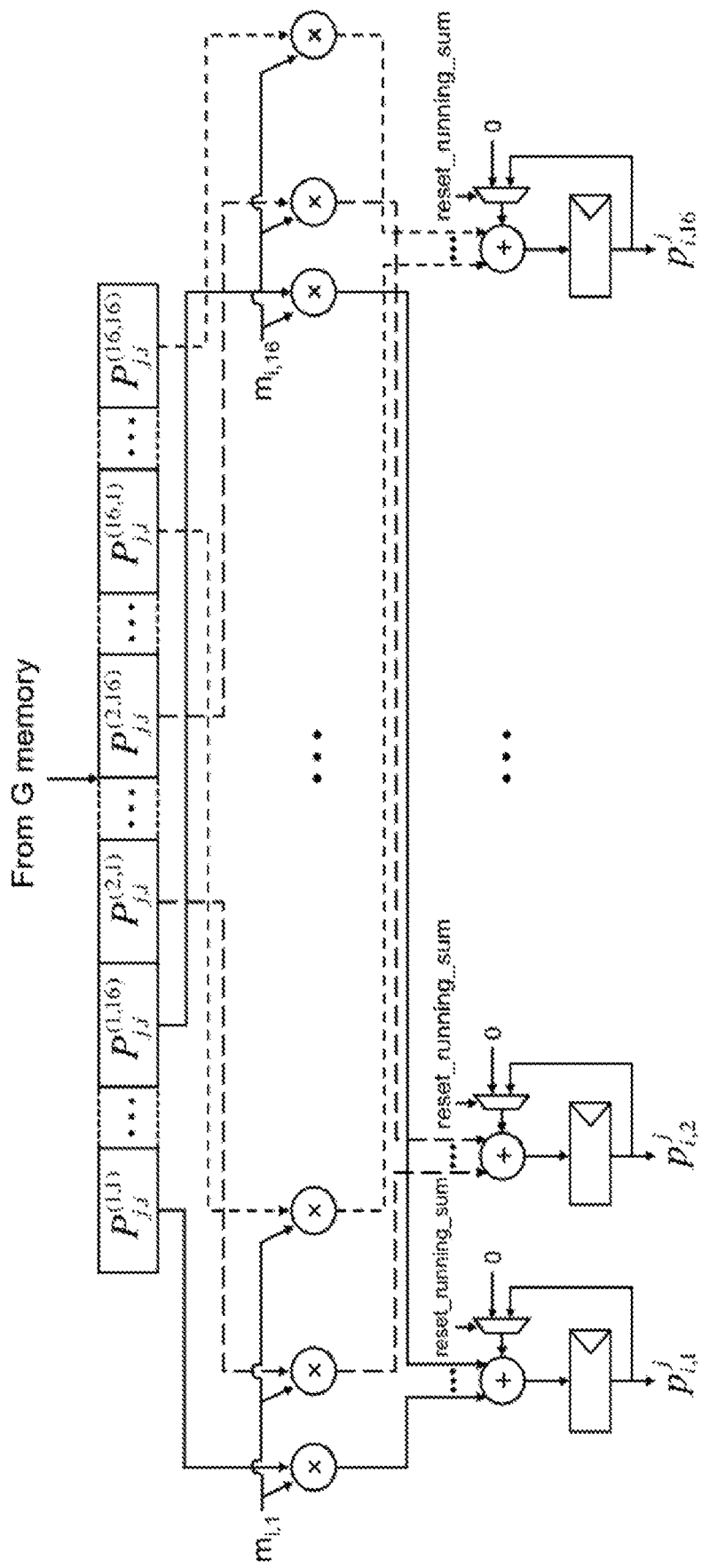
FIG. 13 shows an example of a submatrix processing unit.

A single SPU computes one submatrix multiply operation (one miPi term in the sum in Equation 2.2) every clock cycle. FIG. 13 shows an example of a submatrix processing unit. The partial results for each block row are accumulated serially to find the overall parity symbols for the block column. Since every row in Pi is unique, all rows must be stored in a single word of the G memory. The kth element of the result (where k is between 1 and 16) is found by multiplying each information symbol by the corresponding element in the ith column of the submatrix and adding them (the correspondence between the submatrix element and the memory bit positions is given in FIG. 12B). Therefore, the SPU multiplies each information symbol by each generator row element and adds the appropriate elements together to form the submatrix multiply result. The results are saved in an accumulation register whose output is also added with the rest of the information symbol-generator symbol products. A multiplexer resets the accumulation result to zero when a new block column is started. In the SPU, the signals are 2-bits wide except the 32-bit wide signal from the G memory.

The controller generates all read addresses for the I and G memories, the memory select signal for the I memory, the signal that resets the running sum in the SPUs when a new set of block columns is processed, and the ready signal that controls the frame buffer FSM that feeds information symbols to the RS encoder and scrambler. The controller keeps track of the number of writes to the I memory and the status of the encoder (based on the number of block column sets supplied by configuration registers and the cycle count) to indicate whether the encoder is ready for more data to be written to the I memory and which memory to should be written.

Operation of the encoder includes the following:
1. The scrambler buffers information symbols into the I memory with a high ready signal.
2. Every cycle the encoder reads one entry from the I memory that is not being written.
3. For the first set of block columns, the information symbols are also sent to the read out registers. This is the correct behavior because the code is systematic and the information symbols appear in the codeword in the same order as they are input to the encoder.
4. The 2 SPUs serially compute the submatrix multiplications for the information symbols read from the I memory and store the partial results in registers. Note that two block columns are processed simultaneously.
5. After the last block row in a set of block columns is processed, the results are sent to the read out registers and are serially shifted out (note on the last set of block columns, the last_parity_valid_string signal is used to generate the parity_valid signal since not all SPUs may have a valid output since there may be extras if the block column size is not divisible by the number of SPUs)
6. The SPUs start processing the next set of block columns by reading the next entries from the G memory as normal but also setting the reset running sum signal high.
7. When the encoder finishes processing the last set of block columns, it checks to see if there is another set of information symbols ready in the I memory. If so, it starts encoding the next codeword. If not, it pauses until another codeword is buffered.

2.7 Examples of Decoding NB-LDPC Codes

The message passing equations detailing how to process the reliability information at the variable nodes and check nodes is detailed below.

Linear Combinations of RVs over Finite Algebraic Structures:

Consider the discrete random variable $x \in GF(q)$, which can take on values in the set $\{0, 1, \ldots, q-1\}$. It has a probability mass function (PMF) P(x) given by $$P(x) = \{(P(x=0)=p_0), (P(x=1)=p_1), \ldots, (P(x=q-1)=p_{q-1})\} \quad \text{(Equation 4.1)}$$

where $p_0, p_1, \ldots, p_{q-1}$ sum to 1. The question is: what is P (h×x) where $h \in GF(q)$?

In other words, we are asking for each of the probabilities P(h×x=0), P(h×x=1), . . . , P(h×x=q-1). Rearranging these terms:

$$P(h \times x = 0) \Rightarrow P(x = h^{-1} \times 0) \quad \text{(Equation 4.2)}$$
$$P(h \times x = 1) \Rightarrow P(x = h^{-1} \times 1)$$
$$\vdots$$
$$P(h \times x = q-1) \Rightarrow P(x = h^{-1} \times (q-1))$$

In general $P(h \times x=r) \Rightarrow P(x=h^{-1} \times r)$. Note that $h^{-1} \times \{0, 1, 2, \ldots, q-1\}$ results just in reordering (shuffle) of the set $\{0, 1, 2, \ldots, q-1\}$ by virtue of the closure property of the field multiplication. Thus we see that P(h×x) is a shuffle of the elements of the vector/PMF P(x) by $h^{-1}$. The exact shuffle depends on the primitive polynomial that was used to build the field GF(q), which sets the multiplication table for the field.

Now, consider the following check equation, where all elements are from GF(q):

$$h_1 \times x_1 + h_2 \times x_2 + h_3 \times x_3 = 0 \quad \text{(Equation 4.3)}$$

Each $x_i$ has vector of probabilities, one for each of its possible values, where all elements sum to 1. Now let us ask the question: Given the above relation/constraint between $x_1$, $x_2$ and $x_3$, what is the distribution of $x_1$, given the distributions of $x_2$ and $x_3$?

From a Galois field Fourier transform, for y,s,t∈GF(q), if y=s+t, the distribution of y will be the finite field convolution of the distributions of s and t. In this way, the distribution of $x_1$ can be found as detailed below. From Equation 4.3:

$$-h_1 \times x_1 = h_2 \times x_2 + h_3 \times x_3 \quad \text{(Equation 4.4)}$$

The distribution of $-h_1 \times x_1$ in the above equation, thus, will be the finite field convolution of the distributions of $h_2 \times x_2$ (a shuffle of the distribution of $x_2$ by $h_2^{-1}$) and that $h_3 \times x_3$ (a shuffle of the distribution of $x_3$ by $h_3^{-1}$). Note that $-h_1$ (viz. the additive inverse of $h_1$) is the same as $h_1$ in finite fields of the form GF($2^m$). So the distribution of $x_1$ is obtained by shuffling the result of the above convolution by $(h_1^{-1})^{-1} = h_1$.

There is another way of looking at the above equation. This interpretation will be appreciated later when we deal with the mixed-mode sum-product algorithm (SPA). Equation 4.4 can be re-written for finite fields (note that the negative sign is dropped, which presumes we are in a field of the form GF($2^m$)) as $$x_1 = h_1^{-1} \times h_2 \times x_2 + h_1^{-1} \times h_3 \times x_3 \quad \text{(Equation 4.5)}$$

From Equation 4.5, the distribution of $x_1$ is obtained in two steps: (a) shuffle the distributions of $x_2$ by $h_1 \times h_2^{-1}$ and $x_3$ by $h_1 \times h_3^{-1}$, and (b) take the (finite field) convolution of the shuffled distributions.

Moving from the Linear to the Log Domain Based on a Linear Combination of Two Random Variables:

Consider the discrete random variable x∈GF(2). The log likelihood ration (LLR) of x, LLR(x), is a scalar defined as:

$$LLR(x) \equiv \log_e\left(\frac{P(x=1)}{P(x=0)}\right). \quad \text{(Equation 4.6)}$$

Now consider the discrete random variable y∈GF($2^2$). The LLR of y, (LLR(y)), is a vector of length $2^2-1=3$. It is defined as:

$$LLR(y) \equiv \left[\log_e\left(\frac{P(x=1)}{P(x=0)}\right), \log_e\left(\frac{P(x=2)}{P(x=0)}\right), \log_e\left(\frac{P(x=3)}{P(x=0)}\right)\right]. \quad \text{(Equation 4.7)}$$

The LLR for elements from higher order fields can be defined similarly with q−1 elements in the LLR vector.

Let us now address the question: Given the LLR vectors of $x_1$ and $x_2$, how can we compute the LLR vector of $h_1 \times x_1 + h_2 \times x_2$ where ($h_1$, $h_2 \in$ GF(4))? To answer this, consider an element, $\alpha_i \in$ GF(q) (i.e. $\alpha_i \in$ GF(4) can take values {0, 1, 2, 3}). Then, $$LLR(h_1 \times x_1 + h_2 \times x_2 = \alpha_i) \quad \text{(Equation 4.8)}$$

$$\equiv \ln \frac{P(h_1 \times x_1 + h_2 \times x_2 = \alpha_i)}{P(h_1 \times x_1 + h_2 \times x_2 = 0)} \quad \text{(Equation 4.9)}$$

$$= \ln \frac{\sum_{v \in GF(q)} \frac{P(x_1=v)P(x_2=h_2^{-1} \times (\alpha_i - h_1 \times v))}{P(x_1=0)P(x_2=0)}}{\sum_{v \in GF(q)} \frac{P(x_1=v)P(x_2=-h_2^{-1} \times h_1 v)}{P(x_1=0)P(x_2=0)}}$$

$$= \ln\left[\left(e^{LLR_1(h_1^{-1} \times \alpha_i)} + e^{LLR_2(h_2^{-1} \times \alpha_i)} + \sum_{v \in GF(q)\backslash\{0, h_1^{-1} \times \alpha_i\}} e^{[LLR_1(v)+LLR_2(h_2^{-1} \times (\alpha_i - h_1 v))]}\right)\right] -$$

$$\ln\left(1 + \sum_{v \in GF(q)\backslash\{0\}} e^{[LLR_1(v)+LLR_2(h_2^{-1} \times (-h_1 v))]}\right)$$

$LLR_1(v)$ corresponds to the LLR value of $x_1$ at $x_1 = v$, and similarly for $LLR_2(v)$. The notation $v \in GF(q)\backslash \{0, h_1^{-1} \times \alpha_i\}$ denotes that v takes all the values in GF(q) except {0, $h_1^{-1} \times \alpha_i$}. The second equality is obtained by dividing the top and bottom terms by $P(x_1=0) \cdot P(x_2=0)$ and by expanding the sums inside the P(·)s to account for all events in which the sum is true. The third equality comes from expanding the numerator and denominator and separating the log of the division into a difference of logs. Equation 4.8 can be used for each value of $\alpha_i$ (for a total of q−1 times) to calculate each element of the LLR vector $LLR(h_1 \times x_1 + h_2 \times x_2)$ and thus obtain the entire LLR vector of $h_1 \times x_1 + h_2 \times x_2$.

As has been detailed, in $\mathbb{F}$ (·), $(\alpha_i - h_1 v)$ is $(\alpha_i - h_1 v)$ $\mathbb{F}_{(\cdot)}$ and $(h_2^{-1} \times (-h_1 v))$ is $(h_2^{-1} \times (h_1 v))$ $\mathbb{F}_{(\cdot)}$. In the following, the subscripts indicating the algebraic structure will be omitted for clarity.

Consider $\alpha \in$ GF(4). $\alpha$ takes value 0, 1, 2, 3. Let $h_1=2$ and $h_2=3$. From Table 2.6, $h_1^{-1}=3$ and $h_2^{-1}=2$. Therefore, $$LLR(h_1 \cdot x_1 + h_2 \cdot x_2 = 0) = 0$$

$$LLR(h_1 \cdot x_1 + h_2 \cdot x_2 = 1) = \ln[e^{LLR_1(3 \times 1)} + e^{LLR_2(2 \times 1)+(}$$
$$e^{[LLR_1(v=1)+LLR_2(2 \times (1-2 \times 1))]+(}$$
$$e^{[LLR_1(v=2)+LLR_2(2 \times (1-2 \times 2))]})] = \ln[1+$$
$$e^{[LLR_1(v=1)+LLR_2(2 \times (2 \times 2))]+}$$
$$e^{[LLR_3(v=2)+LLR_2(2 \times (2 \times 2))]+}$$
$$e^{[LLR_3(v=3)+LLR_2(2 \times (2 \times 3))]}]. \quad \text{(Equation 4.10)}$$

Similarly, we can compute, $LLR(h_1 \times x_1 + h_2 \times x_2 = 2)$ and $LLR(h_1 \times x_1 + h_2 \times x_2 = 3)$.

Linear Combination of n Random Variables:

Once again, consider the following check equation, $$h_1 x_1 + h_2 x_2 + h_3 x_3 + h_4 x_4 = 0 \quad \text{(Equation 4.11)}$$

Where $h_1 \ldots, h_4, x_1, \ldots, x_4$ are elements from GF(q). Next, define $\sigma$ and $\rho$ as:

$$\sigma_1 = h_1 x_1, \rho_1 = h_1 x_1 + h_2 x_2 + h_3 x_3 + h_4 x_4$$

$$\sigma_2 = h_1 x_1 + h_2 x_2, \rho_2 = h_2 x_2 + h_3 x_3 + h_4 x_4$$

$$\sigma_3 = h_1 x_1 + h_2 x_2 + h_3 x_3, \rho_3 = h_3 x_3 + h_4 x_4$$

$$\sigma_4 = h_1 x_1 + h_2 x_2 + h_3 x_3 + h_4 x_4, \rho_4 = h_4 x_4 \quad \text{(Equation 4.12)}$$

which can be re-written as, $$\sigma_1 = h_1 x_1, \rho_1 = h_1 x_1 + \rho_2$$

$$\sigma_2 = \sigma_1 + h_2 x_2, \rho_2 = h_2 x_2 + \rho_3$$

$$\sigma_3 = \sigma_2 + h_3 x_3, \rho_3 = h_3 x_3 + \rho_4$$

$$\sigma_4 = \sigma_3 + h_4 x_4, \rho_4 = h_4 x_4 \quad \text{(Equation 4.13)}$$

In accordance with the foregoing description, the probability distributions of each a and each p can be computed recursively using convolutions in the linear domain, and LLR vectors of $\sigma_1, \sigma_2 \ldots \sigma_{n-1}$ and $\rho_1, \rho_2 \ldots \rho_{n-1}$ can be computed recursively using Equation 4.10 in the log domain. The $\sigma$ computations represent a forward recursion, and the $\rho$ computations represent a backward recursion. This is a very efficient method to compute these values. However, the $\sigma$ and $\rho$ quantities are not the LLR vectors of the $x_i$s. Therefore, the question is how can we compute the LLR vectors $LLR(x_1), LLR(x_2), LLR(x_3), LLR(x_4)$ from the LLR vectors of $\sigma$s . . . and $\rho$s?

As discussed earlier, $LLR(x_1)$, is the shuffle of $LLR(\sigma_1)$ by $(h_1^{-1})^{-1} = h_1$. Note that this is true because we are shuffling by the inverse $h_1^{-1}$, and the value to shuffle by is the inverse of the shuffle value. $LLR(x_4)$ can similarly be obtained from $LLR(\rho_4)$. (4.11) can be written in terms of $\sigma$s' and $\rho$s' as below.

$$\sigma_1 + h_2 x_2 + \rho_3 = 0 \quad \text{(Equation 4.14)}$$

$$\sigma_2 + h_3 x_3 + \rho_4 = 0 \quad \text{(Equation 4.15)}$$

Therefore, $$\sigma_1 + \rho_3 = -h_2 x_2 \quad \text{(Equation 4.16)}$$

$$\sigma_2 + \rho_4 = -h_3 x_3 \quad \text{(Equation 4.17)}$$

Using Equation 4.10 we can obtain $LLR(\sigma_1 + \rho_3)$, $LLR(x_2)$ is obtained by shuffling this distribution by $(-h_2^{-1})^{-1} = h_2$ (in $GF(2^m)$, but differs in $GF(p^m)$ where p is a prime not equal to 2 and $\Im(\cdot)$). Similarly proceeding we can obtain $LLR(x_3)$.

This idea can be generalized for obtaining $LLR(x_i)$ for $i = 1 \ldots N$.

Methods to Calculate max*:

Computation of $\max^*(x,y) = \ln(e^x + e^y)$ is an important component finding the linear combination of RVs in the log domain. To see options for its calculation, consider the Jacobian logarithm:

$$\max(x, y) * \equiv \ln(e^x + e^y) \quad \text{(Equation 4.18)}$$
$$= \max(x, y) + \ln(1 + e^{-|x-y|})$$

The second equality can be found by assuming x>y and factoring out $e^x$ and then doing the same assuming y>x.

Figure 14:
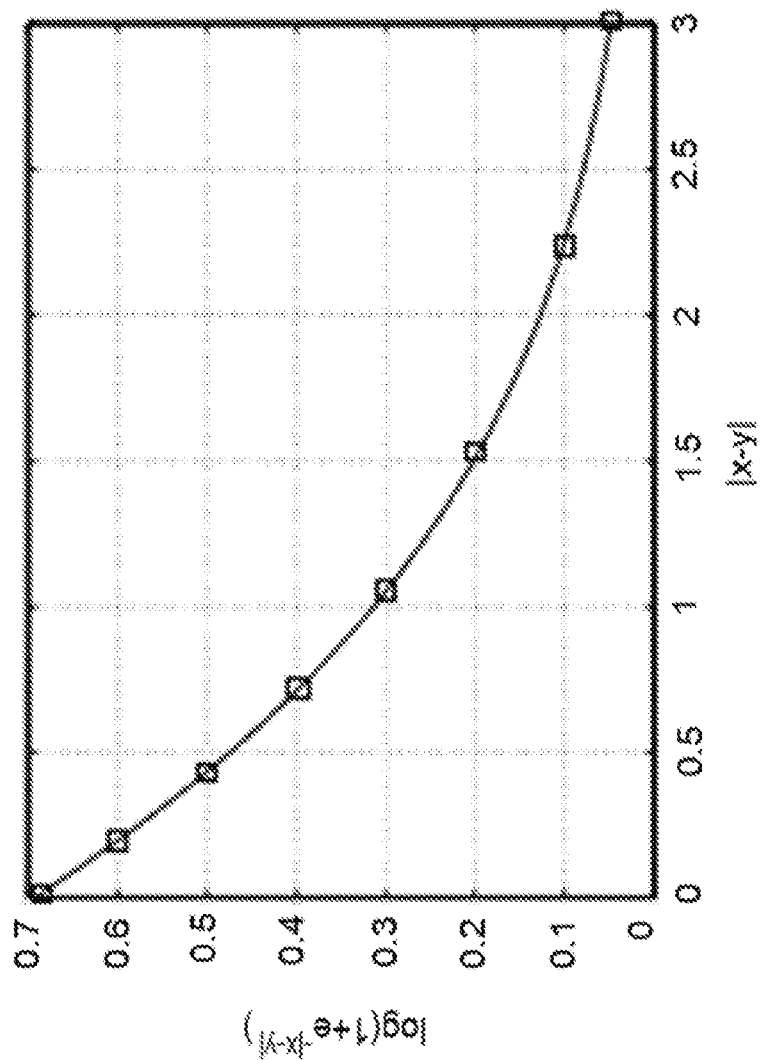
FIG. 14 shows an example plot of the max* function.

FIG. 14 shows a plot of $\log(1 + e^{-|x-y|})$. As can be seen, a comparator and a look up table with eight |x-y| values (sampled at □ points below) from the above graph can implement max(x, y)* with an approximate quantization noise of +/−0.05. This can be realized in hardware as shown in FIG. 15A, assuming D units of clocks and R units of hardware resources.

Figure 15B:
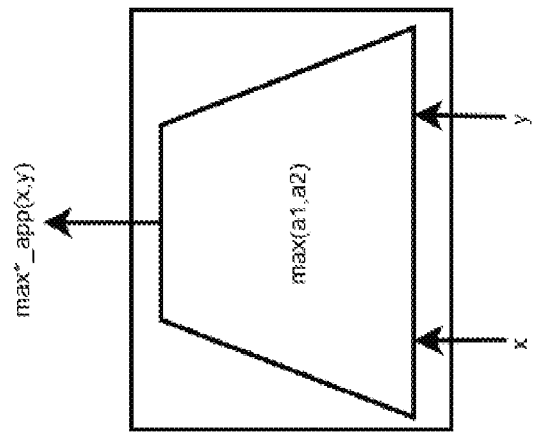
FIGS. 15A-15D show exemplary architectures for various max* functions.
Figure 15A:
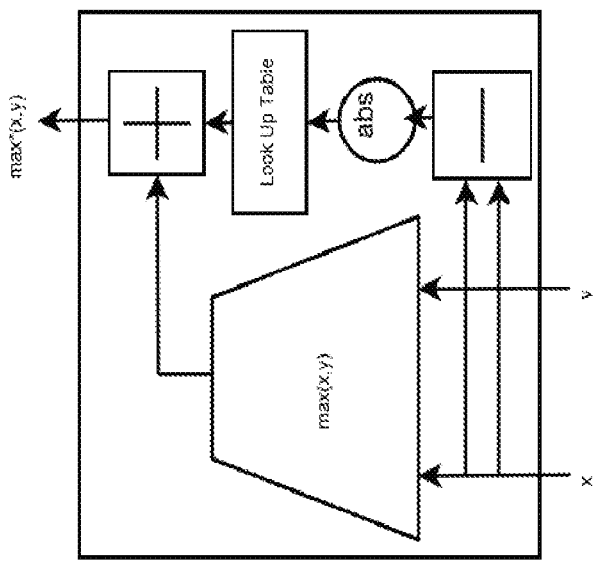

An implementation of the same is also considered as shown in FIG. 15B. Let us denote $D_{app}$ units of clocks and $R_{app}$ units of hardware resources are used for its implementation.

Now consider a 3-input max* (max*$_3$) as given by Equation 4.19. This enables us a low resource high delay implementation of max*$_3$ as given in FIG. 15C. control-1 in FIG. 15C selects one of the inputs to the max*$_2$ block. At the first cycle (beginning), input x and y are selected as inputs to max*$_2$; in the subsequent cycle, the output of the current operation and input variable z are selected. The final output from the max*$_2$ is registered using control-2.

$$\max*(x, y, z) \equiv \ln(e^x + e^y + e^z) \quad \text{(Equation 4.19)}$$
$$= \ln(e^x + e^{\ln(e^y + e^z)})$$
$$= \max*[x, \ln(e^y + e^z)]$$
$$= \max*[x, \max*(y, z)].$$

An approximate implementation of the same can be achieved similarly by concatenating FIG. 15B appropriately.

In general, $$\max*(x_1, x_2, x_3, \ldots x_n) = \max*[x_1, \max*(x_2, \max*(x_3, \max*(x_4 \ldots x_{n-2}, \max*(x_{n-1}, x_n))] \quad \text{(Equation 4.20)}$$

Figure 15D:
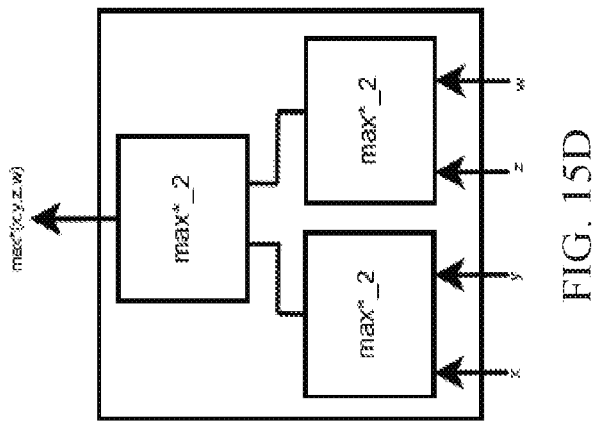
Figure 15C:
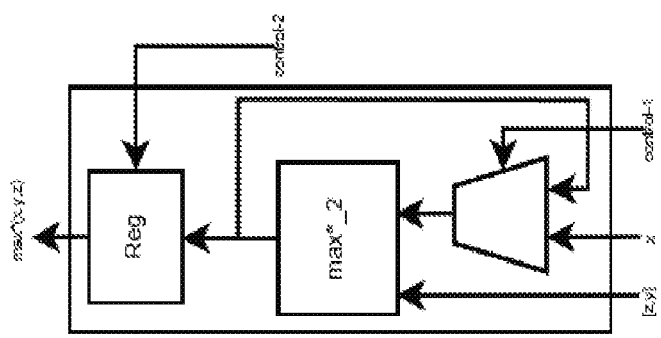

Following the architecture given in FIG. 15C, Equation 4.20 can be implemented. This would use $(N-1) \times D$ units of clocks to complete this operation but would use approximately only $1 \times R$ hardware resources. This implementation is referred as the serial implementation and is denoted as $\max^*_N$.

Now consider the four input max* as below, $$\max*(x, y, z, w) \equiv \ln(e^x + e^y + e^z + e^w) \quad \text{(Equation 4.21)}$$
$$= \ln(e^{\ln(e^x + e^y)} + e^{\ln(e^z + e^w)})$$
$$= \ln(e^{\max*(x,y)} + e^{\max*(z,w)})$$
$$= \max*(\max*(x, y), \max*(z, w))$$

Equation 4.21 points to a parallel architecture (high resource but low delay) for the implementation of max as given in FIG. 15D.

A parallel implementation for max* with N (power of 2) elements (max*$_N$), will use N−1 max*$_2$ elements and would use $\log N_2$ units of clocks.

Figure 16:
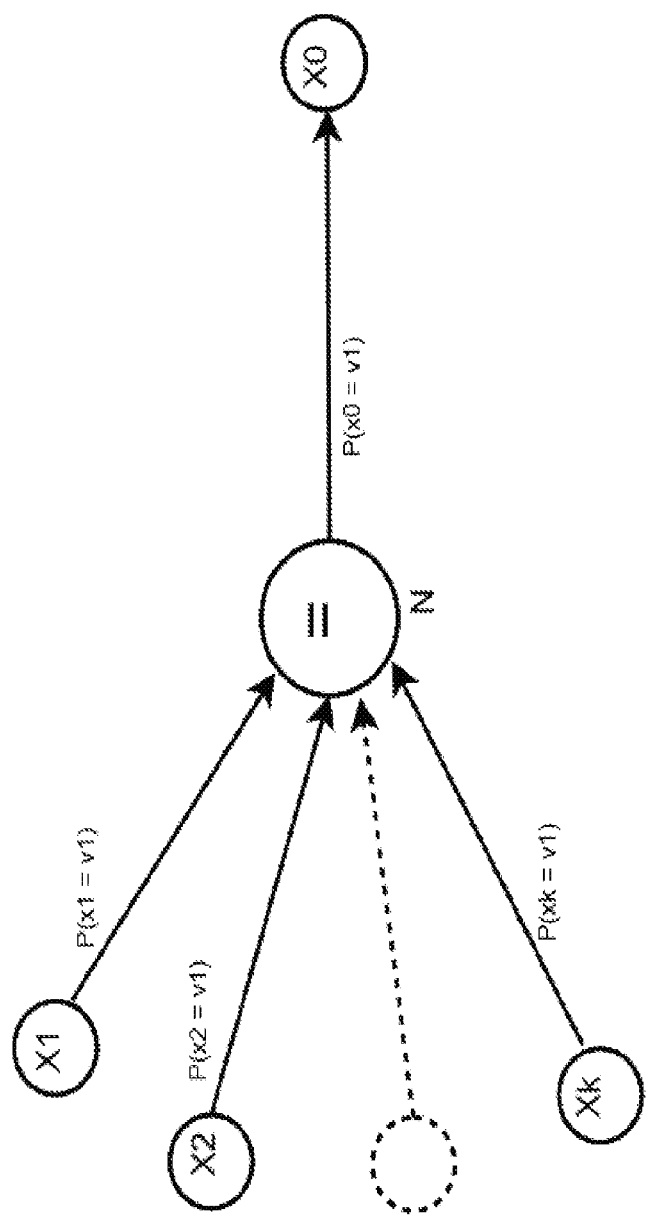
FIG. 16 shows an example of message passing at an equality node.

Message Passing Equations from Variable to Check Messages:

There are at least two types of messages passed in the SPA: from variable nodes to check nodes (V2C) and check nodes to variable nodes (C2V). First, let us look at the V2C messages. The variable node basically enforces a constraint that all incoming messages to it should agree on its probability of taking on each value. FIG. 16 depicts a variable node (marked with an "=" sign due to its equality constraint) with incoming messages indicating what different nodes in the graph the variable node's probability of taking on each of its values is.

Suppose that the variable node N is connected to K+1 edges with associated nodes $x_0, x_1, \ldots, x_k$. The constraint set for this node is: $S_N = \{(x_0, x_1, \ldots, x_k) | (x_0 = x_1 = x_2 \ldots = x_k = V1)\}$. Let $P(x_1 = v_1), P(x_2 = v_1) \cdot P(x_k = v_1)$ represent the probabilities of $x_1, x_2, \ldots, x_k$ to take the value $v_1$. Now, the probability of the output variable of the node $x_0$ to take value $v_1$ is given by $$P(x_0 = v_1) = c' \times P(x_1 = v_1) \times P(x_2 = v_1) \times \ldots \times P(x_k = v_1) \quad \text{(Equation 4.22)}$$
$$= c' \times \prod_{i=1}^{i=k} P(x_i = v_1)$$

where c' is a normalization constant that ensures $\Sigma_{V \in GF(q)} P(x_0 = v) = 1$.

In the log domain, Equation 4.22 becomes $$LLR(x_0) = \ln\frac{P(x_0 = v_1)}{P(x_0 = 0)} \quad \text{(Equation 4.23)}$$

$$= \ln\frac{\prod_{i=1}^{i=k} P(x_i = v_1)}{\prod_{i=1}^{i=k} P(x_i = 0)}$$

$$= \sum_{i=1}^{i=k} LLR(x_i = v_1)$$

Note that no normalization constant is needed here. In summary, for an equality node, the outgoing LLR along one edge is the sum of the incoming LLRs along all of the other edges.

Check to Variable Messages:

Similar to variable nodes enforcing an equality constraint on incoming messages, check nodes enforce a parity check constraint defined by a row of the parity check matrix H. A parity constant states that a linear combination of variables must equal a particular value (usually 0), such as in the following:

$$h_{i,1} \times v_{i,1} + h_{i,2} \times v_{i,2} + \ldots + h_{i,k} \times v_{i,k} = 0 \quad \text{(Equation 4.24)}$$

In the context of the SPA, the k edges entering a check node represent probabilities that the variable node on the other side of the edge takes on each of its possible values. When viewed as k−1 incoming edges and 1 outgoing edge, the k−1 incoming edges and the parity check equation that must be satisfied are used to calculate the probability/LLR vector of the variable node attached to the outgoing edge (note that the outgoing variable node's message is not used). Intuitively, the probability that the node attached to the outgoing edge takes on a value a, is equal to the probability that nodes attached to the incoming edge sum to the additive inverse of $a_i$, a, (in the case of $GF(2^m)$, $\alpha_i = -\alpha_i$). To actually calculate the probability/LLR vector of the $k^{th}$ variable node, the equations derived in earlier sections are used.

In particular, the forward/backward recursion is done using all incoming messages to the check node to calculate each σ and ρ, and then the appropriate σ, ρ LLR vectors are "added" (where added means the operation defined in (4.6) or (4.10)) to form each variable's C2V message.

Figure 17:
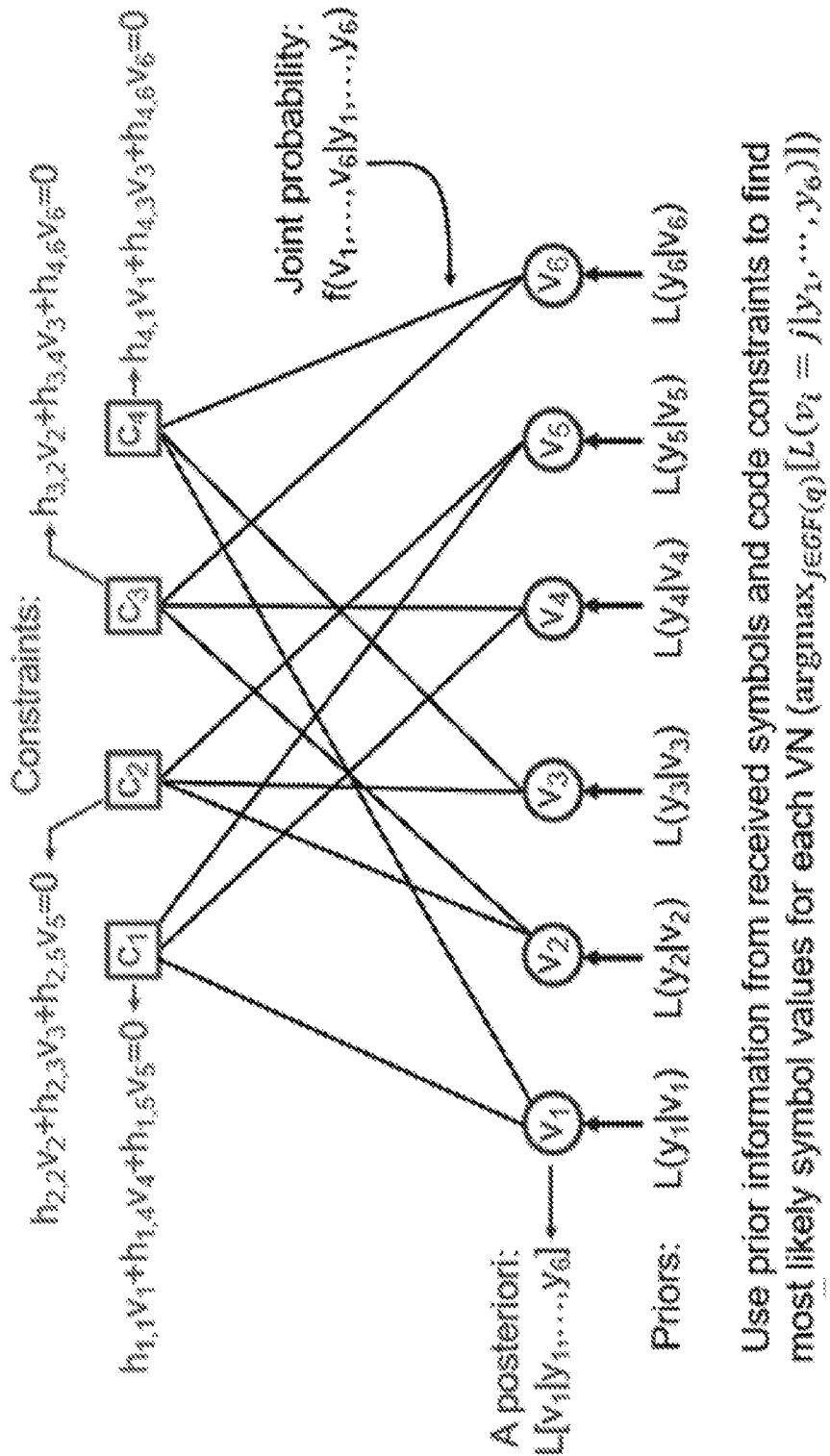
FIG. 17 shows an example of messaging on a Tanner graph.

Tanner Graph and Message Passing:

A pictorial representation of the above using Tanner graphs is shown in FIG. 17. As shown therein, C2V1,1 represents the probability that VN1=a1 given the current probabilities of VN4 and VN5 taking on particular values and the entries in the H matrix that permute the probabilities. V2C1,1 represents the probability that VN1=a1 given the C2Vs of neighboring CNs other than CN1.

2.8 Examples of NB-LDPC Decoder Architectures

Figure 18:
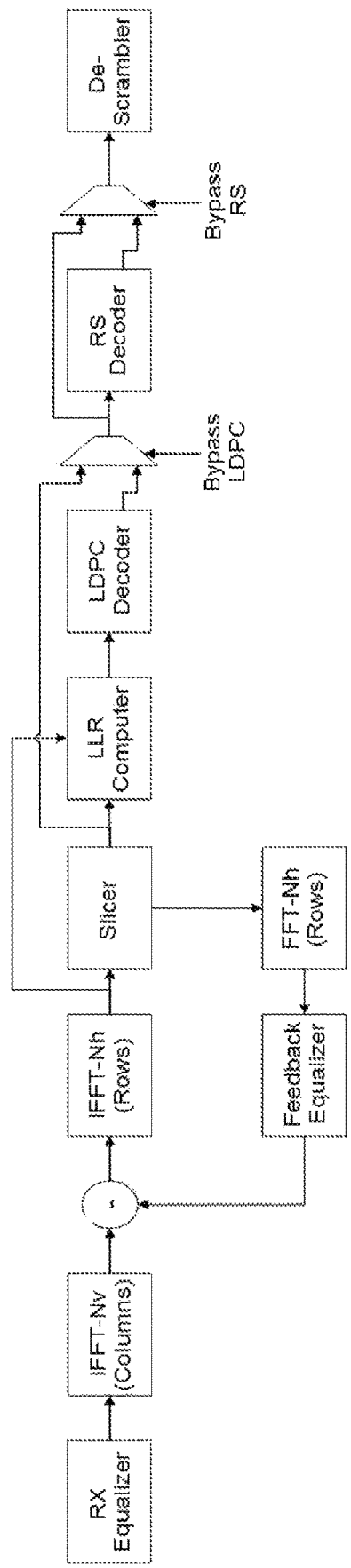
FIG. 18 shows an example of an LDPC decoder within a receive chain.

Layered SPA:

The LDPC decoder belongs to the receive chain, and it sits between the Slicer/LLR Computer and the Reed-Solomon (RS) Decoder (FIG. 18). The RS decoder may be bypassed if only the LDPC code is being used, in which case the LDPC decoder passes the data directly to the descrambler. The LDPC decoder can also be bypassed, in which case the RS decoder gets data directly from the Slicer and sends the data to the descrambler. Similarly, they can both be bypassed which allows the data to be sent un-coded.

There are two different options when it comes to decoding algorithms. A flooding type algorithm where each variable node and check node pass information iteratively until convergence and a layered algorithm where only a subset of variable and check nodes pass information iteratively until convergence. In this example implementation the layered algorithm is implemented. It is more easily implemented in hardware and converges faster.

Figure 19:
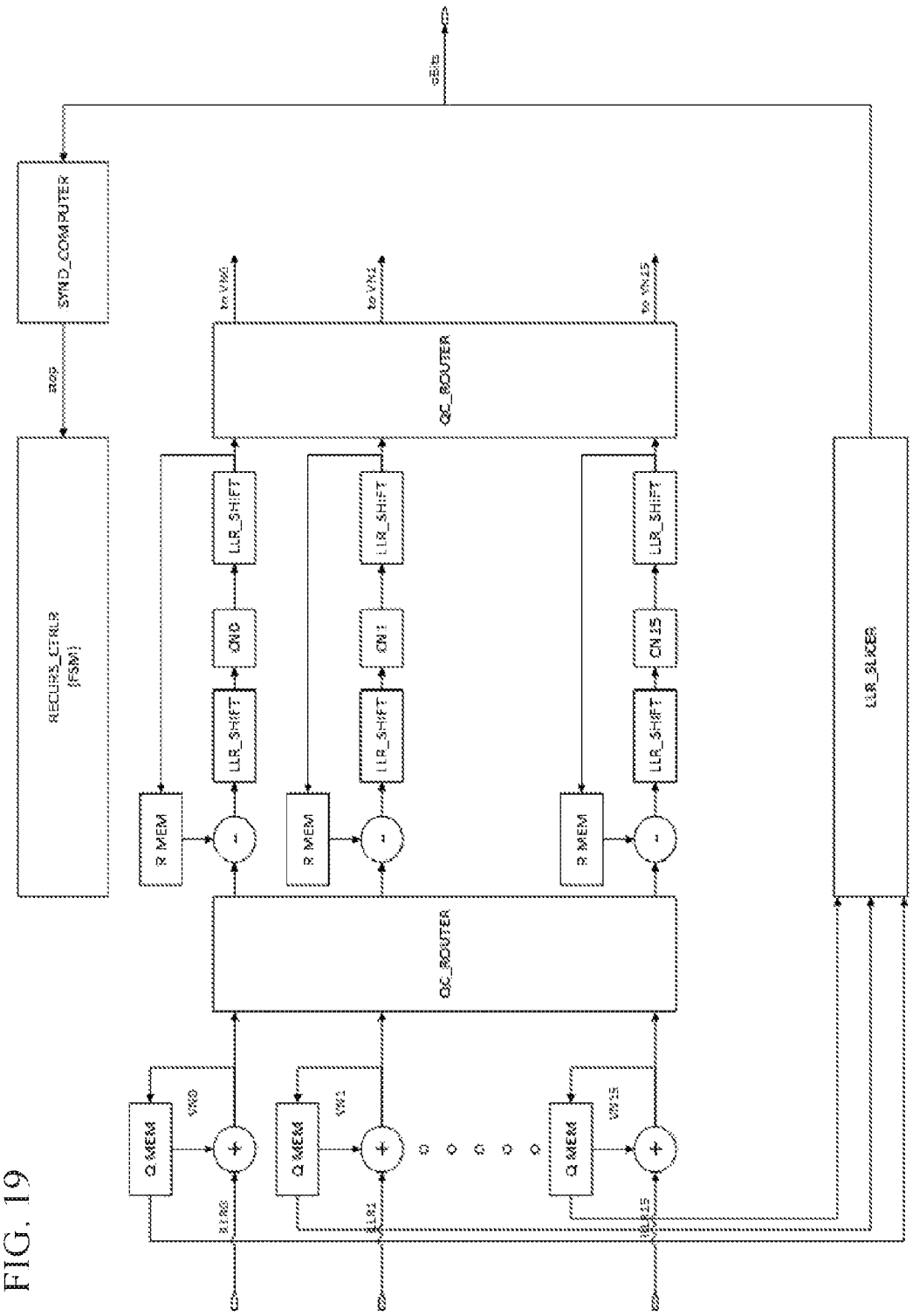
FIG. 19 shows an example of the LDPC decoder architecture.

2.8.1 Examples of Partially Parallel Architectures for NB-Decoding Using Layered Schedule FIG. 19 depicts the architecture for decoding one data that is associated with one circulant sub-matrix of size Q. In this example realization circulant matrix size is taken to be 16×16. The decoder is broken up into seven main components: (1) the variable node (VN), (2) the quasi-cyclic router (qc_router), (3) the LLR permuter (llr_shift), (4) the check node (CN), (5) the recursion controller (recurs_ctrlr), (6) the mapper from LLR values to bits (llr_slicer), and (7) the LDPC Syndrome Computer (synd_computer).

Decoding operation begins with the LLR values coming from the LLR computer (described in section 5). VNs receive this a priori LLR values for each of the VNs and initialize the Q memory with these values. V2C messages are calculated. In the first iteration they are just the initial a priori LLR values). In general, V2C messages are calculated as follows: $(Q_{new} = Q_{old} + R_{new} - R_{old})$ C2V messages are responsible for the R values both old and new are used to calculate the extrinsic Q values. After all of the iterations and layers have completed, these Q values (without subtracting the old R values) are sent to the LLR Slicer to be transformed into bits.

A Variable Node (VN), also referred to as the bit node, initially receives the a priori LLR values from the LLR computer. These values initialize the Q memory before any extrinsic or a posteriori LLR values have been computed. The VN provides the V2C messages that allow for the CN to calculate the calculate the CT, p, and R values which are required in order to calculate the a posteriori LLR values. The final LLR values are stored in the Q Memory and ultimately end up in the LLR slicer for conversion from LLRs to bits.

The Quasi-Cyclic Router (QC_ROUTER) takes in as inputs the current submatrix to provide the routing requirements for the given submatrix that is being processed. The QC Router is implemented using a series of mux stages in order to route the inputs to the correct outputs.

The LLR Permuter (LLR_SHIFT) takes in as inputs the current set of 3 LLRs and permutes them based on the input hi,j element. For example, the hi,j element (which is an element of GF(4) {1, 2, 3} only nonzero values are considered) could be 3. The GF(4) inverse of 3 is 2, so this would permute the incoming LLRs by 2 shifts such that {LLR1, LLR2, LLR3} would become {LLR3, LLR1, LLR2}. The architecture of the LLR Permuter is also known as LLR_Shift.

The Check Node (CN) is used for the computation of σ and ρ, the forward and backward recursion respectively, and ultimately, the computation of R. R is essentially the set of LLR a posteriori values for a given code symbol and its value is iterated on until the decoder is complete. The final R values will ultimately end up at the VN where the final Q values will be calculated. The input to the CN is the extrinsic LLR values that are computed by subtracting the new Q values with the previous R values as explained earlier. Internally, the CN will store the previous extrinsic information and that will be used to calculate the new R values. This process will continue until all layers and iterations have completed. The value of the row weight will determine the number of variable nodes that each check node sends a message to. The Check Node is comprised of two elementary check nodes (ECN) to parallelize the σ, ρ, and R calculations.

The Elementary Check Node (ECN) is the building block for the Check Node. Its purpose is to calculate the following equation:

$$\ln(e^{LLR_1(0)} + e^{LLR_1(h_1^{-1}\alpha_i)} + e^{LLR_2(h_2^{-1}\alpha_1)} + e^{LLR_2(0)}) +$$
$$\ln\left(\sum_{v \in GF(q) \setminus \{0, h_1^{-1}\alpha_i\}} e^{[LLR_1(v) + LLR_2(h_2^{-1}(\alpha_i - h_1 v))]}\right) -$$
$$\ln\left(1 + \sum_{v \in GF(q) \setminus \{0\}} e^{[LLR_1(v) + LLR_2(h_2^{-1}(-h_1 v))]}\right)$$

Herein. the above equation may be interpreted as three separate equations, one for each value of α.

Figure 20:
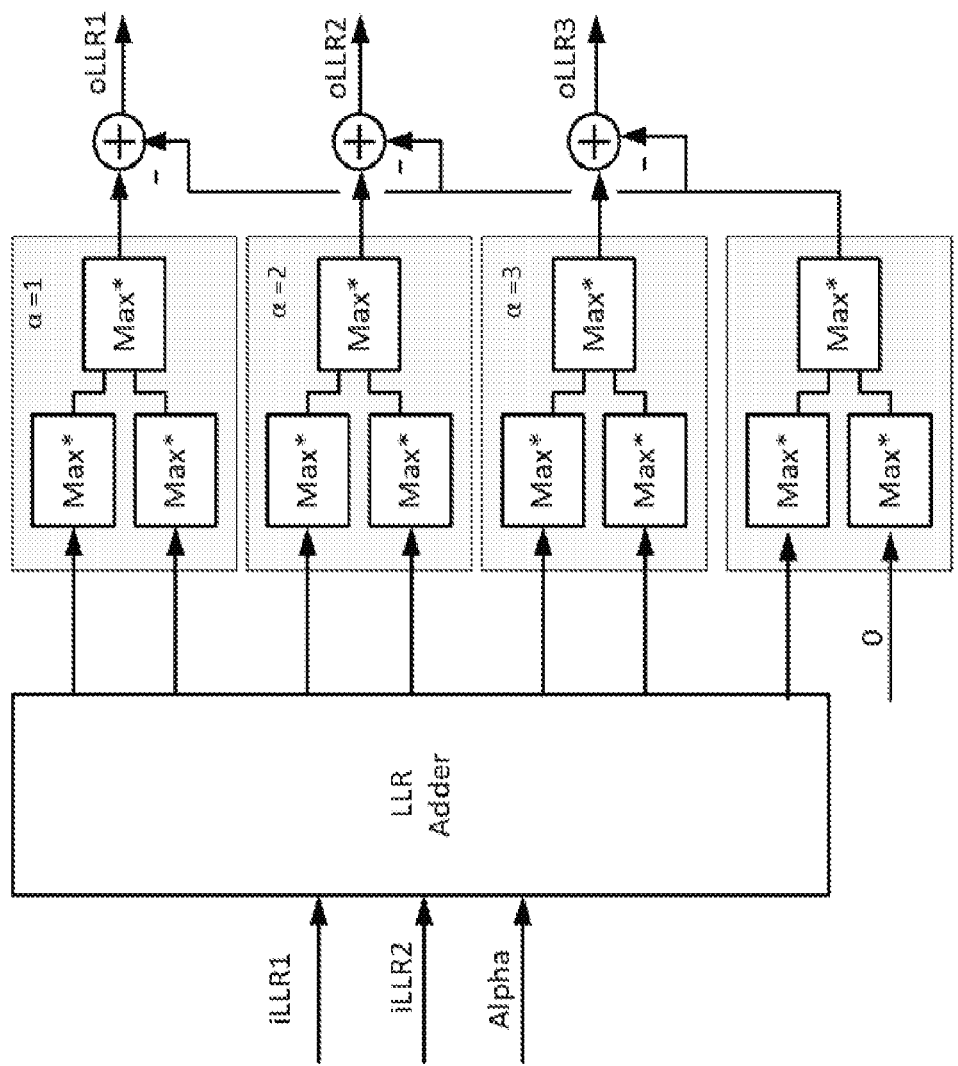
FIG. 20 shows an example architecture for an elementary check node (ECN).

Due to the LLR permuters before and after the CN, all values of h and $h^{-1}$ are equal to 1 since 1 is the inverse of 1 in GF(4). This simplification makes the computation of all the different combinations much less hardware intensive. The Elementary Check Node architecture is shown in FIG. 20.

In this architecture, all combinations of LLR additions are created and sent to the correct max* operation depending on α. The max* operation is in its own module due to the need to approximate it as simply a max operation. Currently it is implemented as purely a max operation but can be quickly adapted to any variety of approximations.

Figure 21:
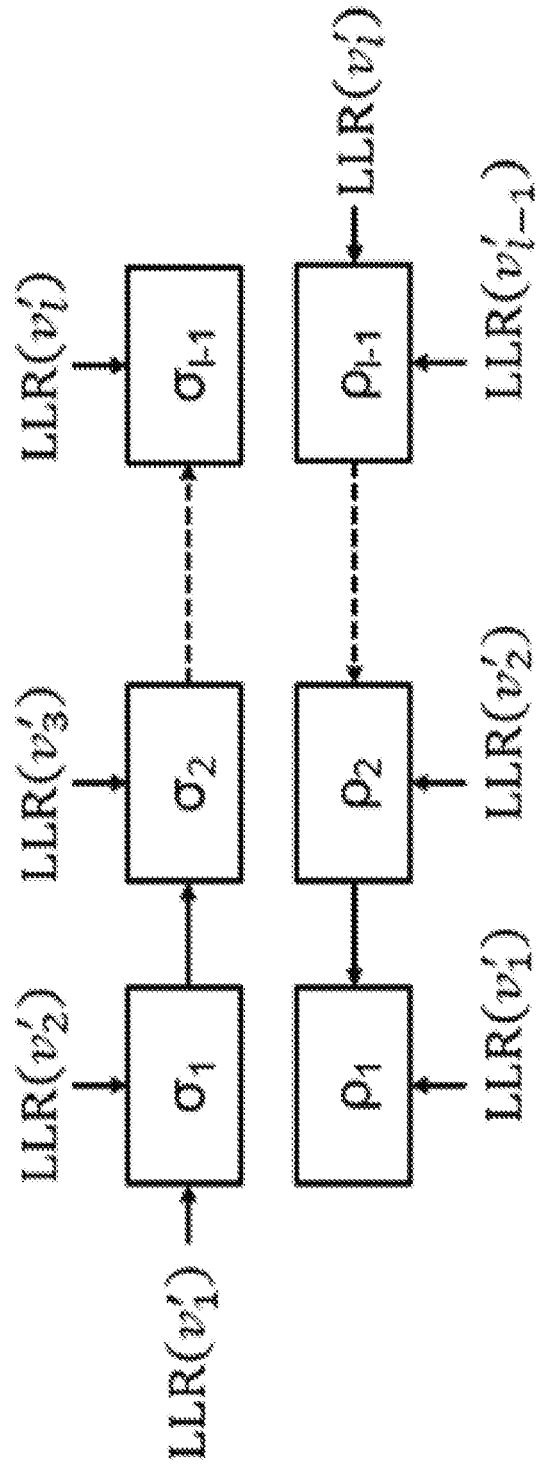
FIG. 21 shows an example of a recursive calculations used in LLR computations.

In some embodiments, σ is computed as (given by Eq. 4.12) in the forward recursion. while ρ is computed in the backward (Eq. 4.12) recursion, and R (Eq. 4.8) is computed using σ and ρ, as shown below and with a pictorial representation of it given in FIG. 21.

("add (eg. 4.8)" + shuffle) for R $R_{i,1} = h_{i,1}^{-1} \rho_{l-1}$ $R_{i,2} = h_{i,2}^{-1} (\sigma_1 + \rho_{l-2})$ $\vdots$ $R_{i,l} = h_{i,l}^{-1} \sigma_{l-1}$ 2.8.2 Log Likelihood Ratio Computer Received symbols from the equalizer prior to slicing can be represented as, $$y(k) = \gamma_k x(k) + n(k) \quad \text{(Equation 5.1)}$$

where y(k) is the received QAM symbol, x(k) is the transmitted QAM symbol, $\gamma_k$ is a channel quality measure (relative attenuation/fading the transmitted symbol have experienced) and n(k) is Additive White Gaussian Noise (AWGN). In OFDM systems, for example, due to fading, certain sub-carriers undergo erasure and $\gamma_k$ can be thought of as a quantity inversely related to the intensity of erasure. In OTFS systems, the fading is absent and here we assume $\gamma_k$ to be always 1.

We use LDPC codes in GF(4). Thus we have 2 bits per each LDPC symbol. LDPC decoder requires a measure of reliability for each symbol, viz. LLR of all the $2^2-1$ bit sequences to perform the soft decoding (equation 4.7). This can be calculated in two ways, a) symbol wise and b) bit wise. Symbol-wise LLR computation is applicable to even order constellations (QAM4, QAM16, QAM64, QAM256 etc.) whereas bit-wise LLR computer may be used for both even and odd order constellations (QAM4, QAM8, QAM16, QAM32, . . . )

LDPC Symbol-Wise LLR Computer:

Consider a QAM constellation. Each constellation point consists of say dR number of bits. For e.g., dR=6 for QAM64 and so on. Now, consider a set with c number of consecutive bits in this constellation. Let's say c=2. then we have 3 such sets associated with each QAM64 symbol (first, middle and last). Consider one such set. It can take $2^c$ ($2^2$=4 in our example) distinct values in general. Let us assume that one of the constellation points, say, x was transmitted. Let us say y was received. y can fall anywhere on the constellation plane. Out of the 2dR constellation points, let there be α number of constellation points where these c bit positions of x are identical ($s^{(c)} = x_1 x_2 \ldots x_c$) where s is the LDPC symbol). Let there be β number of constellation points where these c bit positions are a $0(s^{(c)} = 0_1 0_2 \ldots (\cdot)0_c)$.

Since we assume AWGN in Equation 5.1, we get, $$P(x(k) = a/y(k)) = (K/\sigma) \times e^{-(y(k)-a)^2/(2\sigma^2)} \quad \text{(Equation 5.2)}$$

where K is a constant and $\sigma^2$ is the noise variance.

From above, LLRs can be written as, $$LLR(s^{(c)} = x_1 x_2 \ldots x_c) = \ln\left[\frac{\sum_{i=1}^{\alpha} P(s^{(c)} = x_1 x_2 \ldots x_c)/y(k)}{\sum_{i=1}^{\beta} P(s^{(c)} = 0_1 0_2 \ldots 0_c)/y(k)}\right] \quad \text{(Equation 5.3)}$$

An LLR vector is computed by computing Equation 5.3 for all combinations of $x_1 x_2 \ldots x_c$. (Thus there are a total of $2^c - 1$ number of LLRs in a LLR vector.)

From Equation 5.2, this can be seen to be of the form, $$LLR(s^{(c)} = x_1 x_2 \ldots x_c) = \ln[e^{p_1} + e^{p_2} + \ldots + e^{p_\alpha}] - \quad \text{(Equation 5.4)}$$
$$\ln[e^{q_1} + e^{q_2} + \ldots + e^{q_\beta}]$$
$$\approx \ln\left[\max_i(e^{p_i})\right] - \ln\left[\max_i(e^{q_i})\right]$$

For higher order modulations, α and β in the above expression are prohibitively expensive. So, for computational tractability, we limit the search space to a few salient constellation points determined by the position of the current received symbol y(k). This approximation translates to only using the closest constellation points that has $s^{(c)} = x_1 x_2 \ldots x_c$ and $s^{(c)} = 0_1 0_2 \ldots 0_c$ in the computation of $LLR(s^{(c)} = x_1 x_2 \ldots x_c)$, and has yielded good results in a gray coded constellation.

Figure 22A:
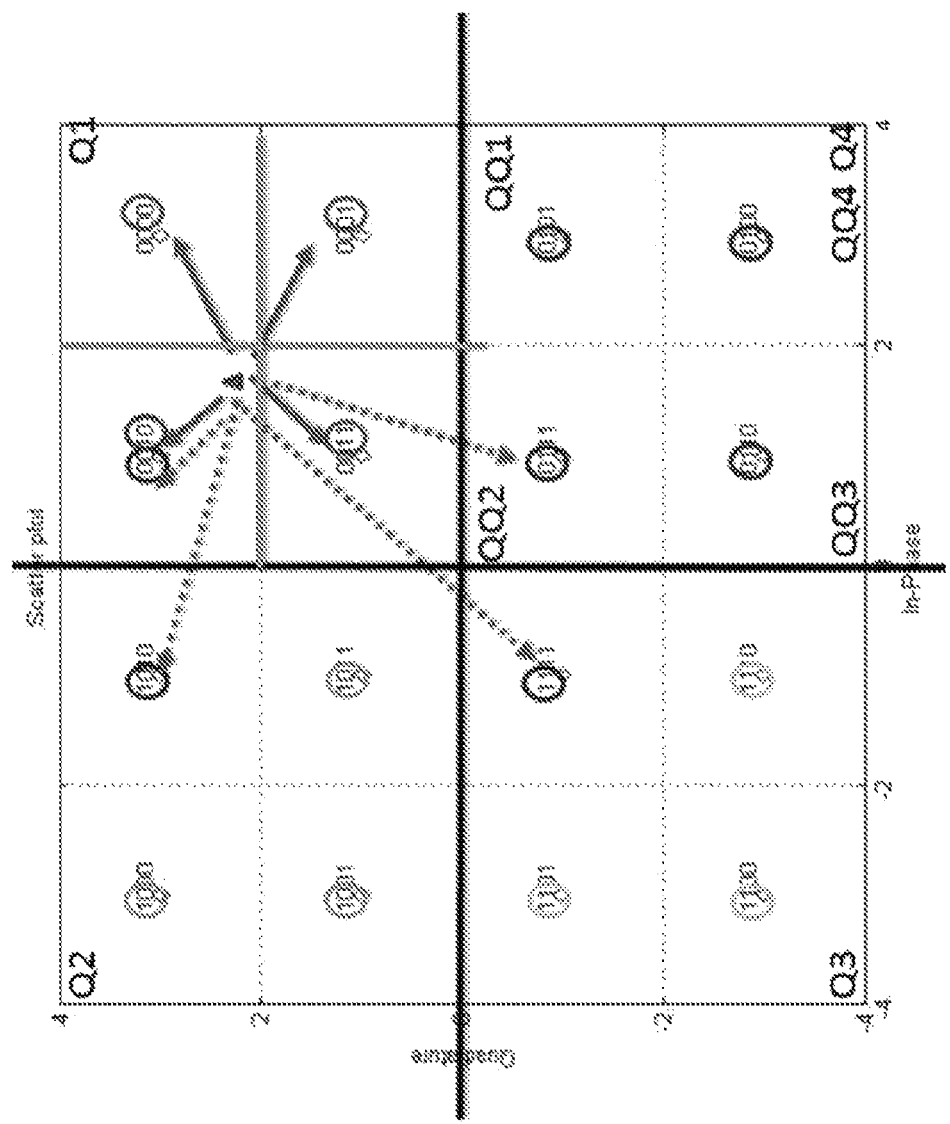
FIGS. 22A and 22B show an example of an LDPC-symbol-wise and bit-wise LLR computation, respectively, for a 16-QAM constellation.
Figure 22B:
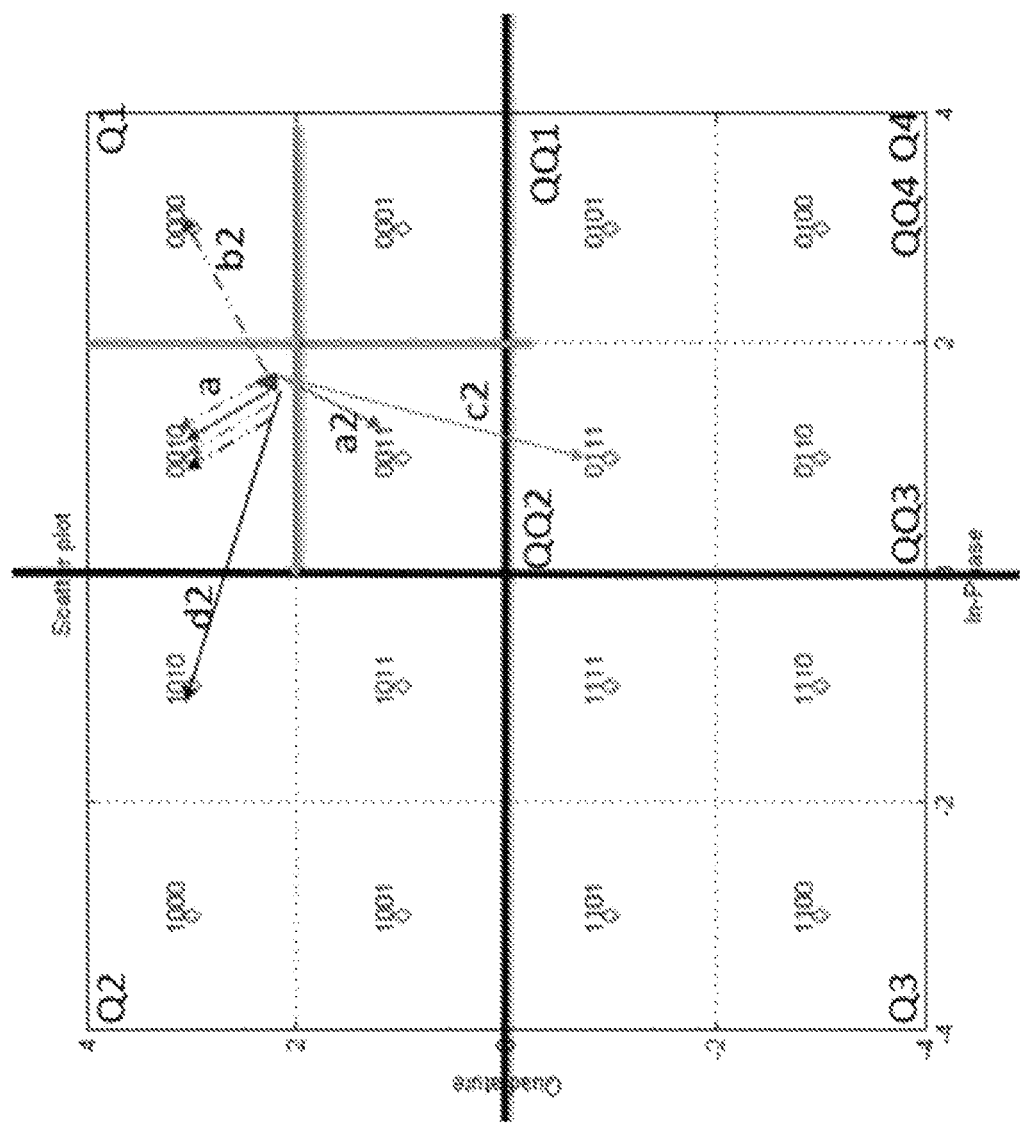

FIG. 22A depicts an example of a 16-QAM constellation. The constellation is divided into Quadrants Q1, Q2, Q3 and Q4. Each of them is further sub-divided into QQ1, QQ2, QQ3 and QQ4 as shown in FIG. 22B. Consider a received QAM symbol in Q1-QQ2 as shown by the triangle (solid triangle in upper right quadrant of FIG. 22A). Under low to medium noise conditions, the transmit symbol could be any of the 4 constellation points in Q1 or Q2-QQ1 or Q2-QQ4 or Q4-QQ2 or Q4-QQ1. Now consider the 4 constellation points in Q1. The upper 2 bits of these points do not change within Q1. The lower two bits take values 00, 01, 10 and 11 (marked with a blue circle (four circles around values 00, 01, 10, 11)). It can be seen that incorrect transitions to Q2-QQ1 or Q2-QQ4 or Q4-QQ2 or Q4-QQ1 will not affect the correctness of decoding of the lower two bits. Thus for the two lower bits, distances marked in blue are a measure of reliability. That is, the received QAM symbol will have the lower two bits mapped to the bit pair which has the lowest distance among the 4 (bits 10 in the figure). LLRs of the two lower bits of the received symbol, is thus given by the normalized distances viz. 0, d1–d0, d2–d0, d3–d0 (where d0, d1, d2 and d3 are the distances to the lower two bits—00, 01, 10 and 11—given by the arrows in the figure). Now consider the upper two bits (circles in the figure). Note that they do not change within Q1. The nearest points to a likely transition to 00, 01, 10 and 11 for the upper two bits are shown by the red circles. LLRs of these two bits can be computed exactly as above.

Bit-Wise LLR Computer:

To find $LLR(s^{(c)}=x_1 x_2 \ldots x_c)$, we can, instead, look at the LLRs of individual bits and combine them to get the required LLR of a certain group of bits.

For example, the LLR for the previous example is recalculated bit-wise, as shown in FIG. 22B. Proceeding as in the previous example, from the figure, we can see that $LLR(s^{(1)})=a2-a$, $LLR(s^{(2)})=a-b2$, $LLR(s^{(3)})=c2-a$ and $LLR(s^{(4)})=d2-a$, where $s^{(1)}$ corresponds to the rightmost bit in the constellation point.

From the definition of LLRs, we know that $P(s^{(1)}=1)=P(s^{(1)}=0) \times e^{LLR(s^{(1)})}$. Therefore, $LLR(s^{(c)})$ can be calculated from individual-bit LLRs as below:

$$LLR(s^{(c)} = 11) = \quad \text{(Equation 5.5)}$$

$$\ln\left[\frac{P(s^{(1)}=0) \times P(s^{(2)}=0) \times e^{LLR(s^{(1)})+LLR(s^{(2)})}}{P(s^{(1)}=0) \times P(s^{(2)}=0)}\right] = \sum_{i=1}^{2} LLR(s^{(i)})$$

Computing similarly we can see that, $LLR(s^{(c)}=10)=LLR(s^{(2)})-0$, $LLR(s^{(c)}=01)=0+LLR(s^{(1)})$ and $LLR(s^{(c)}=00)=0+0$.

LLR computation described thus, works for both odd and even order constellation whereas the symbol-wise LLR computer works only for even order constellations.

Conversion Between Symbol-Wise and Bit-Wise LLRs:

Given a finite sequence of bits:

$$\{b_1, b_2, \ldots, b_n\} = \{b_i\} \quad \text{(Equation 5.6)}$$

Each bit has an associated probability, $P(b_i=1), P(b_i=0)$ where $P(b_i=1)+P(b_i=0)=1$. Since the bits are assumed to be independent, then $$P([b_1, b_2, \ldots, b_n] = [v_1, v_2, \ldots, v_n]) = \prod_{i=1}^{n} P(b_i = v_i) \quad \text{(Equation 5.7)}$$

Every sequence of bits that b can be represented with an unsigned integer (e.g., 3='10'). Let P(k) denote the probability that $b_i$ takes the form of the sequence of bits which is the binary representation of the unsigned integer k (i.e., $k=b(1)\times 2^0+b(2)\times 2^1+\ldots b(n)\times 2^{n-1}$). Using this notation, LLR vector of size n sequence (of bits) is:

$$LLR = \log\left(\frac{[P(1), P(2), P(3), \ldots, P(2^n-1),]}{P(0)}\right) \quad \text{(Equation 5.8)}$$

As expected, this LLR vector is of size $2^n-1$. Another way to represent this LLR vector is by individually describing each element.

$$LLR_k = \log\left(\frac{P(k)}{P(0)}\right) \quad \text{(Equation 5.9)}$$

$$LLR_k = \log\left(\frac{\prod_{i=1}^{n} P(b_i - k[i])}{\prod_{i=1}^{n} P(b_i = 0)}\right) \quad \text{(Equation 5.10)}$$

$$LLR_k = \log\left(\prod_{i=1}^{n} \frac{P(b_i = k[i])}{P(b_i = 0)}\right) \quad \text{(Equation 5.11)}$$

$$LLR_k = \sum_{i=1}^{n} \log\left(\frac{P(b_i = k[i])}{P(b_i = 0)}\right) \quad \text{(Equation 5.12)}$$

$$LLR_k = \sum_{i=1}^{n} k[i]\log\left(\frac{P(b_i = 1)}{P(b_i = 0)}\right) \quad \text{(Equation 5.13)}$$

Where k[i] denotes the ith bit in the binary representation of the unsigned integer k. Since k[i] can either be 0 or 1, in the case where it is 0 it cancels out with the denominator. We now see the resemblance of an LLR of an individual bit, represented by $LLR(b_i)$ as the LLR of bit $b_i$:

$$LLR(b_i) = \log\left(\frac{P(b_i = 1)}{P(b_i = 0)}\right) \quad \text{(Equation 5.14)}$$

$$LLR_k = \sum_{i=1}^{n} k[i] LLR(b_i) \quad \text{(Equation 5.15)}$$

In summary, it has been found that $$LLR_k = \log\left(\frac{P(k)}{P(0)}\right) = \sum_{i=1}^{n} k[i] LLR(b_i) \quad \text{(Equation 5.16)}$$

if and only if the sequence of bits $b_i$ is independent. Thus a length $2^n-1$ LLR vector can be represented with n bit-wise LLRs. In particular, if (LDPC) symbols consist of 2 bits, then a symbol-wise LLR will have three elements: (a, b, c). This result shows that the bits are independent if and only if a+b=c.

LLR Calculation:

Given a constellation with an associated bit pattern, it can be converted into two tables containing the individual hits (see below for example):

$$\begin{array}{|c|c|} \hline 2 & 0 \\ \hline 3 & 1 \\ \hline \end{array} \rightarrow \left\{ \begin{array}{|c|c|c|c|} \hline 1 & 0 & 0 & 0 \\ \hline 1 & 1 & 0 & 1 \\ \hline \end{array} \right\} \quad \text{(Equation 5.17)}$$

For each such table of bits, given a soft decision point (output of the equalizer), a single bit LLR can be calculated using:

1) Find the distance to the nearest point containing a 0, let this distance be $d_0$.
2) Find the distance to the nearest point containing a 1, let this distance be $d_1$.

$$LLR = d_0^2 - d_1^2 \quad \text{(Equation 5.18)}.$$

3) Check to see if this makes sense—if very close to 1, then much farther from 0, and $d_0{}^2 > d_1{}^2$, meaning that the LLR will be positive. If we are very close to 0 and far from 1, then the LLR will be negative, as expected with the convention that $$LLR_k = \log\left(\frac{P(1)}{P(0)}\right).\quad\text{(Equation 5.19)}$$

In some embodiments, if the constellation bit pattern obeys a regular symmetry (as do the even constellations) then simple computation can be done to deduce the closest 0 point and closest 1 point. If, on the other hand, the constellation bit-pattern does not have such a symmetry, a look-up table based technique is be used to find these points. The look-up table, with finite number of elements, in some cases will work as an approximation to the direct computation (and thus would be not as exact as the direct computation)

In some embodiments, hardware supports symbol-wise LLR computer.

Figure 23:
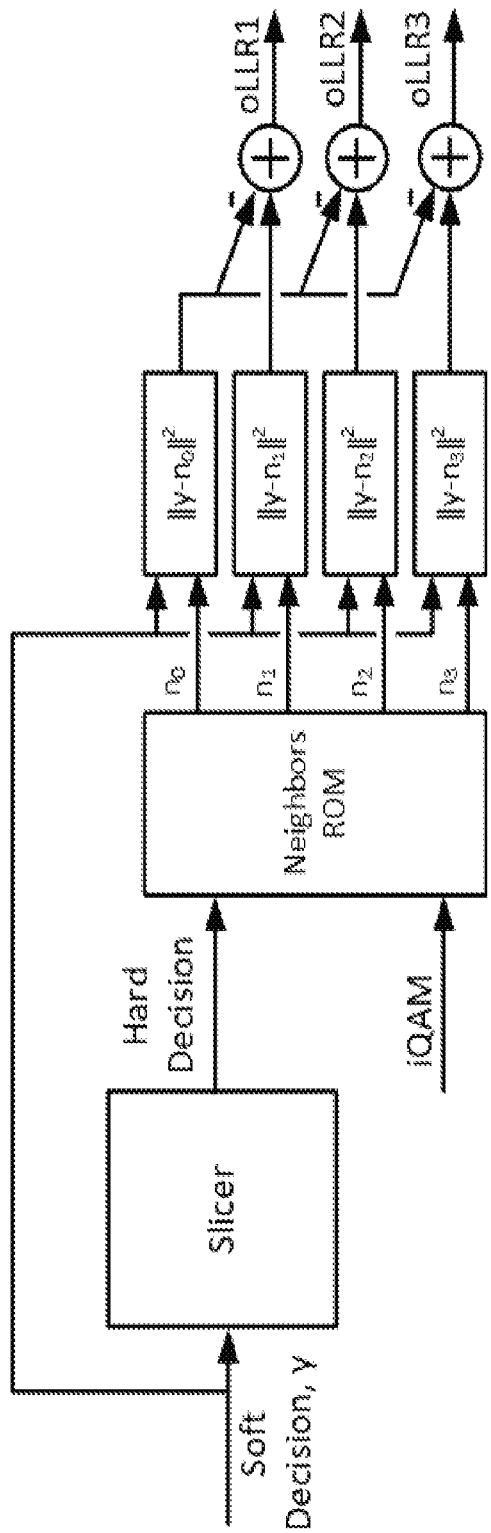
FIG. 23 shows an example of an LLR computation architecture.

LLR Computer Architecture:

As shown in FIG. 23, LLR computer receives a) the soft-symbol estimates in (tau, nu) domain from the Decision Feed back equalizer and b) hard symbol estimates from the slicer. The LLR computer outputs a set of LLR values corresponding to each soft estimate. LLR values goes as input to the LDPC decoder.

LLR Computer:

Even order constellations has even number of bits in each symbol. Each LDPC symbol in GF(4) consists of 2 bits. Each such symbol will have 4 neighbors. Thus in the case of 4-QAM there's only one set of neighbors, in the case of 16-QAM there are 2 sets of neighbors and so on up to 1024-QAM in which case there are 5 sets of neighbors. Each set of 4 neighbors is used to calculate 4 Euclidean distances between the neighbors and the input soft estimate, resulting in sets of 4 such distances which in fact represent LLRs. One such LLR corresponds to the LDPC symbol '00'. This LLR will be subtracted from the other 3, (the normalization of LLR). These 3 normalized LLRs will then be sent to the LDPC Decoder to be processed.

The Euclidean distances between the signal y=y_I+jy_Q and a point of the constellation n=n_I+jn_Q are calculated as follows:

$$\|y-n\|^2 = (y_I - n_I)^2 + (y_Q - n_Q)^2 \quad\text{(Equation 5.20)}.$$

A block diagram of the algorithm described above shown in FIG. 23.

The hard decisions from the Slicer (signal s), together with the respective QAM order are used to derive the addresses to a ROM that contains all the "neighbors" associated with every point in all the square QAM constellations.

To calculate the ROM allocated for each constellation, the following may be used:

4-QAM: there are 4 points, each with 1 set of 4 neighbors, so its allocated memory should be 1 block of 4 words.
16-QAM: there are 16 points, each with 2 sets of 4 neighbors, so its allocated memory should be 2 blocks of 16 words each.
64-QAM: there are 64 points, each with 3 sets of 4 neighbors, so its allocated memory should be 3 blocks of 64 words each.
256-QAM: there are 256 points, each with 4 sets of 4 neighbors, so its allocated memory should be 4 blocks of 256 words each.
1024-QAM: there are 1024 points, each with 5 sets of 4 neighbors, so its allocated memory should be 5 blocks of 1024 words each.

3 Exemplary Methods for NB-LDPC Coding in OTFS Systems

Figure 24:
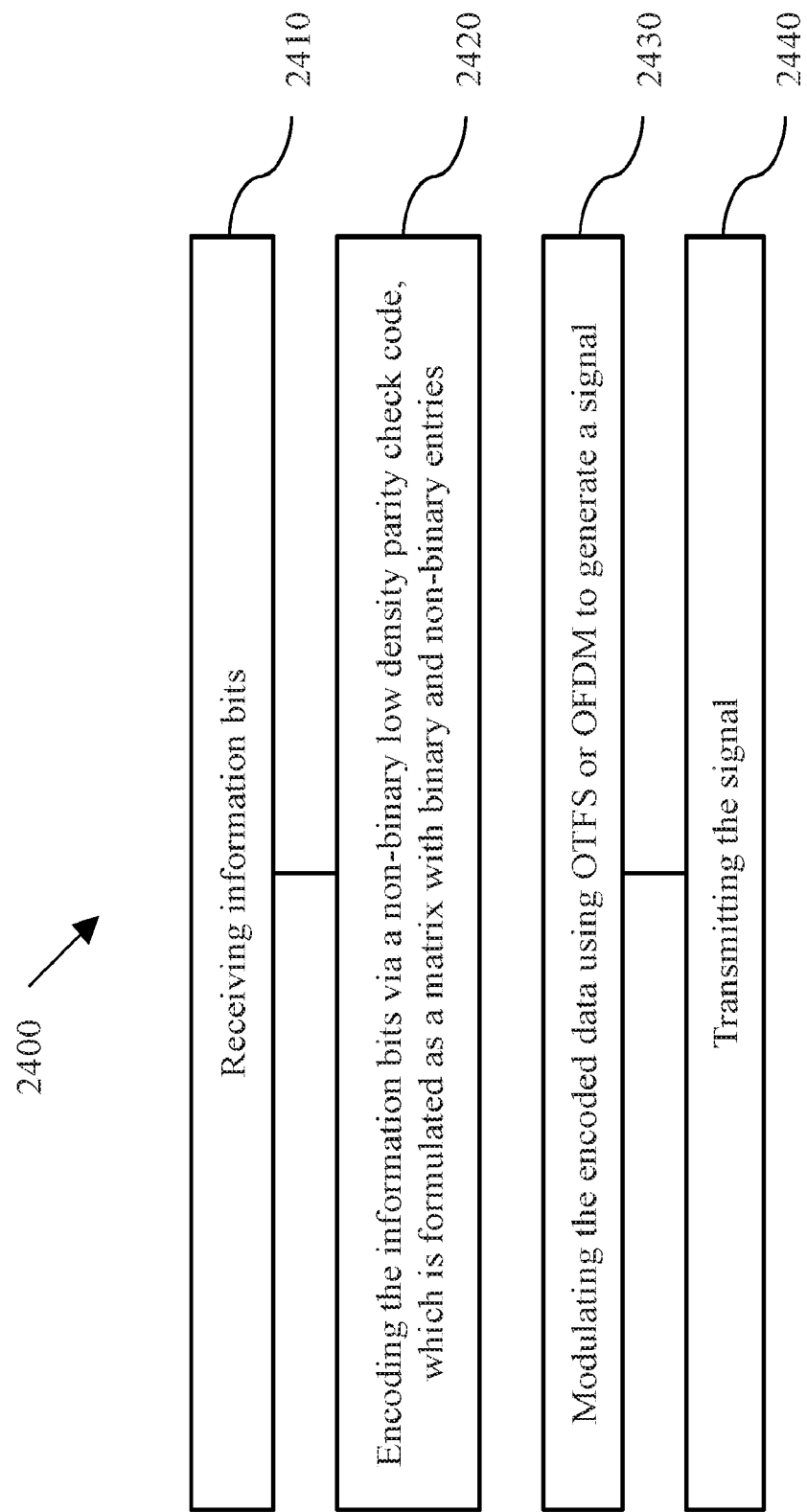
FIG. 24 shows an example method for forward error correction, in accordance with some embodiments of the presently disclosed technology.

FIG. 24 shows an example of a method 2400 for forward error correction in wireless systems. The method 2400 includes, at step 2410, receiving information bits. The information bits may be received from applications or users and may be intended for transmission over the transmission medium of the wireless system.

The method 2400 includes, at step 2420, encoding the information bits via a non-binary low density parity check code, which can be formulated as a matrix with binary and non-binary entries. Section 2 of the present document provides examples of the matrix representation of the NB-LDPC code.

The method 2400 includes, at step 2430, modulating the encoded information bits to generate a signal. In some embodiments, the modulating is performed in accordance with orthogonal time frequency space (OTFS) modulation. In other embodiments, the modulating is performed in accordance with orthogonal frequency division multiplexing (OFDM).

The method 2400 includes, at step 2440, transmitting the signal over a channel. As previously discussed, one advantageous aspect of the use of NB-LDPC is to both use the AWGN statistical properties of noise ingress and also use the low complexity implementation of NB-LDPC to achieve very low BER performance. In particular, because OTFS modulation spreads a symbols over the entire bandwidth of the channel, frequency localized noise ingress still does not degrade performance of NB-LDPC, due to "averaging" or "whitening" effect over the entire bandwidth of the symbol.

In some embodiments, transmitting the signal includes transmitting a radio frequency signal over the air or a wire. In other embodiments, transmitting the signal includes transmitting an optical signal over a fiber optic cable.

Figure 25:
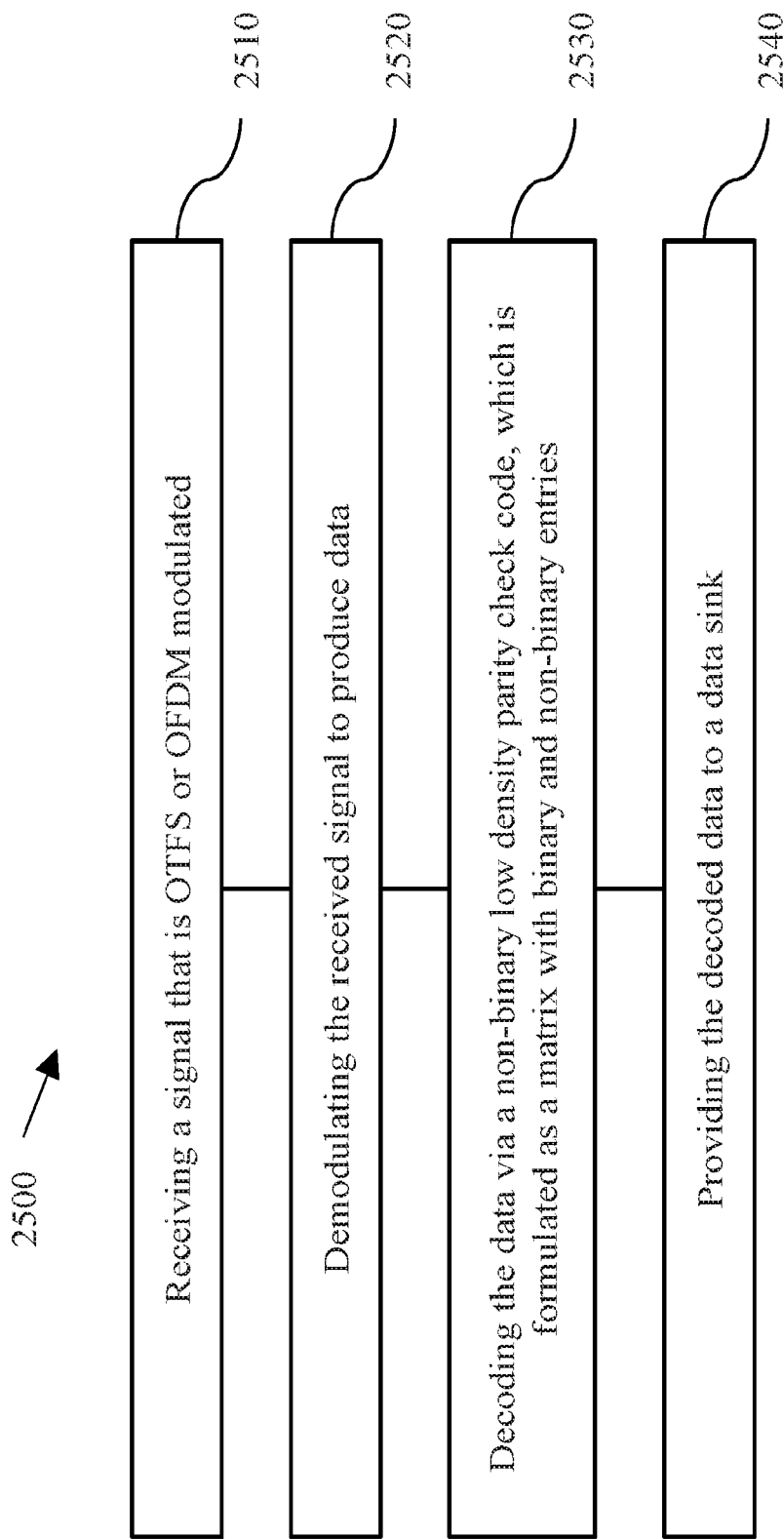
FIG. 25 shows an example method in accordance with some embodiments of the presently disclosed technology.

FIG. 25 shows another example of a method 2500 for forward error correction in wired or wireless systems. The method 2500 includes, at step 2510, receiving a signal. The signal may be received by a wired or wireless device that is communicating with other devices in the wireless system. The received signal may be modulated using OFDM or OTFS modulation and may include user and control data transmitted by a transmitter. In some embodiments, receiving the signal includes receiving a radio frequency signal over the air or a wire. In other embodiments, receiving the signal includes receiving an optical signal over a fiber optic cable.

The method 2500 includes, at step 2520, demodulating the received signal to produce data. In some embodiments, the demodulating is performed in accordance with orthogonal time frequency space (OTFS) modulation. In other embodiments, the demodulating is performed in accordance with orthogonal frequency division multiplexing (OFDM).

The method 2500 includes, at step 2530, decoding the data via a non-binary low density parity check decoder, which is characterized by a matrix with binary and non-binary entries.

The method 2500 includes, at step 2540, providing the decoded data to a data sink. The data sink may be, for example, applications and services running on the wired or wireless device that receives the signal.

4 Example Embodiments for the Disclosed Technology

Figure 26:
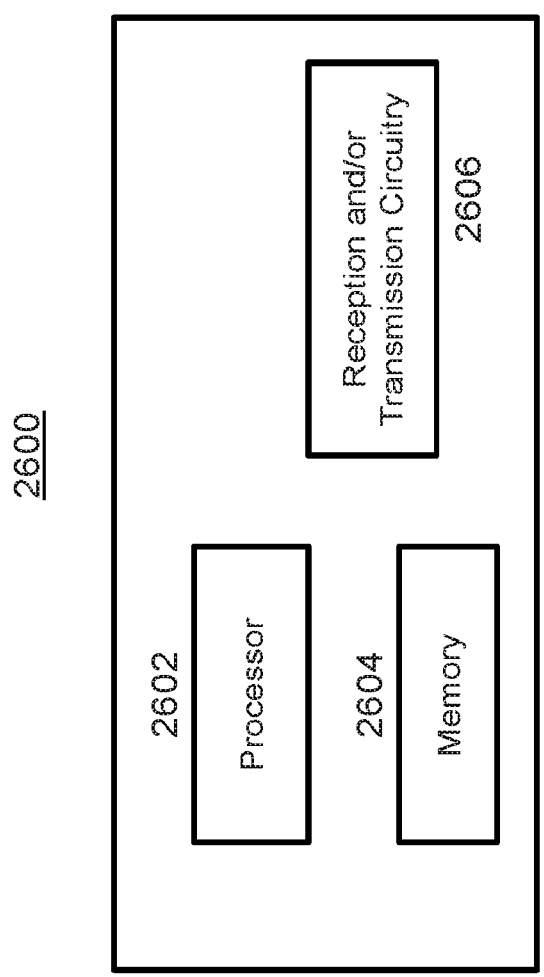
FIG. 26 is a block diagram representation of a portion of an apparatus, in accordance with some embodiments of the presently disclosed technology.

FIG. 26 shows an example of an apparatus, in accordance with some example embodiments. The apparatus 2600 may be used to implement methods 2400 and 2500 and/or the processes in the following sections. The apparatus 2600 includes a processor 2602, a memory 2604 that stores processor-executable instructions and data during computations performed by the processor. The apparatus 2600 includes reception and/or transmission circuitry 2606 including, for example, radio frequency or optical operations for receiving or transmitting signals, or read/write heads of a magnetic disk drive.

Aspects disclosed in this patent document include a forward error correction method, including encoding and decoding data which using a non-binary LDPC error correction code. Non-binary LDPC error correction code may be transmitted and received over a wireless or wireline medium, or used in devices such as disk drives. Encoded data may be further modulated using OTFS or OFDM or other modulation. An encoder H matrix is described. The H matrix may be found via a search methodology including the removing of 4 cycles and 6 cycles, followed by interleaving and choosing non-binary values for the circulant matrix. The error floor of a non-binary LDPC code found using this methodology to determine an H matrix has very low error flow far below other codes. A single H matrix may be used to generate punctured codes with a variety of rates such 8/16, 9/16, . . . , 15/16, and others where each code rate is derived from the same H matrix An architecture for the above is disclosed including a partially parallel architecture for the decoder. Compared to binary LDPC, a modified permuter may be used. An architecture for decoding the NB LDPC layered SPA (sum product algorithm) modified for non-binary use and architecture. Two different forms of max* computation are disclosed (the serial and parallel) in the decoder and their architecture. Max* is a modified version for a NB-Code. Normalization of the log likelihood ratio is disclosed. LDPC symbol-wise normalized LLR computation methodology is disclosed. LDPC bit-wise normalized LLR computation methodology is disclosed and an architecture is disclosed.

Various example embodiments of the above-described LDPC encoder and decoder operation may be described using a clause-based description format as follows:

1. A forward error correction method performed at a receiver, comprising: receiving, over a channel, a signal that is modulated using an orthogonal time frequency space (OTFS) or an orthogonal frequency division multiplexing (OFDM) modulation scheme, demodulating the received signal to produce data; decoding the data via a non-binary low density parity check (NB-LDPC) code, by formulating the NB-LDPC code as a matrix with binary and non-binary entries; andproviding the decoded data to a data sink.

2. The method of clause 1, wherein the signal received by the receiver undergoes symbol spreading over entire bandwidth of the channel, thereby having error statistics that are mathematically represented as an additive white gaussian noise.

3. The method of clause 1, wherein the NB-LDPC code comprises a structured regular systematic repeat accumulate code over a non-binary field.

4. The method of clause 3, wherein a parity matrix H for the NB-LDPC code comprises a non-binary matrix generated from a binary H matrix. Various examples of the H matrix are described in Section 2.

5. The method of clause 4, wherein the binary H matrix is based on a computer search algorithm.

6. The method of clause 5, wherein the computer search algorithm terminates when no N-cycles are present in a Tanner graph representation of the binary H matrix, and wherein N=4 or 6. Additional description is provided with reference to FIG. 8 and FIG. 17.

7. The method of clause 4, wherein the parity check matrix H is represented as H=[H_1,H_2], where is the parity part and is the systematic part, wherein both and are composed of blocks of circulant permutation matrices and zero matrices of block size Q, where Q is an integer.

8. The method of clause 1, wherein the demodulating the received signal to produce data includes operating a slicer and a log likelihood ratio (LLR) computer stage on intermediate data generated from the received signal.

9. The method of clause 1, wherein the decoding data includes performing decoding using one of a flooding type algorithm or a layered algorithm.

10. The method of clause 8, wherein the LLR computer is either a symbol-wise LLR computer or a bit-wise LLR computer.

11. The method of clause 10, wherein the symbol-wise LLR computer calculates LLR for a LDPC symbol using:

$$LLR(s^{(c)} = x_1 x_2 \ldots x_c) = \ln \left[ \frac{\sum_{i=1}^{\alpha} P(s^{(c)} = x_1 x_2 \ldots x_c)/y(k)}{\sum_{i=1}^{\beta} P(s^{(c)} = 0_1 0_2 \ldots 0_c)/y(k)} \right]$$

where P is a probability function, i is an integer, c is an integer number of consecutive bits of a constellation in the OTFS or OFDM modulated signal, and x and y represent transmitted and received constellation points, respectively.

12. The forward error correction method of clause 1, wherein the receiving the signal includes receiving a radio frequency signal over the air.

13. The forward error correction method of clause 1, wherein the receiving the signal includes receiving a radio frequency signal over a wire.

14. The forward error correction method of clause 1, wherein the receiving the signal includes receiving an optical signal over a fiber optic cable.

15. A forward error correction method performed at a transmitter, comprising: encoding information bits via a non-binary low density parity check (NB-LDPC) code, wherein the NB-LDPC code is formulated as a matrix with binary and non-binary entries, modulating, using orthogonal time frequency space (OTFS) or orthogonal frequency division multiplexing (OFDM), the encoded information bits to generate a signal; and transmitting the signal over a channel.

16. The method of Clause 15, wherein the signal received by the receiver undergoes symbol spreading over entire bandwidth of the channel, thereby having error statistics that are mathematically represented as an additive white gaussian noise.

17. The method of clause 15, wherein the NB-LDPC code comprises a structured regular systematic repeat accumulate code over a non-binary field.

18. The method of clause 17, wherein a parity matrix H for the NB-LDPC code comprises a non-binary matrix generated from a binary H matrix.

19. The method of clause 15, wherein the data is scrambled prior to encoding with the NB-LDPC code.

20. The method of clause 15, wherein the encoding with the NB-LDPC code comprises processing through a four-stage architecture comprising a top controller, an input interface, a core and a transmit interface for outputting the encoded data.

21. The method of clause 20, further comprising storing information symbols from the data in the core.

22. The method of clause 21, wherein the core comprises an I memory, a G memory, a submatrix processing unit, a readout register and a core controller, wherein the method further includes: holding the information symbols in the I memory during computations; holding a submatrix of calculations in the G memory; computing the parity submatrix and corresponding portion of a message vector by the submatrix processing unit; reading out results of calculations in the core using the readout register; and controlling operation of the core using the core controller.

23. The forward error correction method of clause 15, wherein the transmitting the signal includes transmitting a radio frequency signal over the air.

24. The forward error correction method of clause 15, wherein the transmitting the signal includes transmitting a radio frequency signal over a wire.

25. The forward error correction method of clause 15, wherein the transmitting the signal includes transmitting an optical signal over a fiber optic cable.

26. An apparatus comprising a memory storing instructions and a processor, wherein the instructions, when executed by the processor, cause the processor to perform a method of any of clauses 1 to 25.

27. A computer-readable medium having code stored thereon, the code comprising instructions, when executed, causing a processor to implement a method recited in any one or more of clauses 1 to 25.

Various additional implementation details are provided in the encoder implementation details sections 2.5 and 2.6 and decoder implementation details section 2.8. From the foregoing, it will be appreciated that specific embodiments of the invention have been described herein for purposes of illustration, but that various modifications may be made without deviating from the scope of the invention. Accordingly, the invention is not limited except as by the appended claims.

It will be appreciated that the disclosed techniques can be used to improve reception performance of wireless apparatus and/or reduce complexity of implementation.

The disclosed and other embodiments, modules and the functional operations described in this document can be implemented in digital electronic circuitry, or in computer software, firmware, or hardware, including the structures disclosed in this document and their structural equivalents, or in combinations of one or more of them. For example, the various LDPC encoder and decoder configurations may be implemented partially in software, and partly in hardware circuits. Matrix operations and iterative calculations, for example, may be implemented in processor-executed code, while division and accumulation operations may be performed in hardware circuits.

The disclosed and other embodiments can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this patent document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable subcombination.

Moreover, although features may be described above as acting in certain combinations and even initially claimed as such, one or more features from a claimed combination can in some cases be excised from the combination, and the claimed combination may be directed to a subcombination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A method for forward error correction performed at a receiver, comprising:
   receiving, over a channel, a signal that is modulated using an orthogonal time frequency space (OTFS) modulation scheme;
   demodulating the signal to produce data;
   decoding the data, via a non-binary low density parity check (NB-LDPC) code, by formulating the NB-LDPC code as a matrix with binary and non-binary entries; and
   providing an output of the decoding to a data sink,
   wherein a parity matrix H for the NB-LDPC code is based on a binary H matrix, and
   wherein the binary H matrix is based on a computer search algorithm configured to add offsets to entries in a first column and entries in a first row of the binary H matrix such that the first column and the first row contain only identity elements.

2. The method of claim 1, wherein the NB-LDPC code comprises a structured regular systematic repeat accumulate code over a non-binary field.

3. The method of claim 2, wherein the parity matrix H for the NB-LDPC code comprises a non-binary matrix generated from the binary H matrix.

4. The method of claim 3, wherein the computer search algorithm is further configured to:
   terminate upon a determination that no N-cycles are present in a Tanner graph representation of the binary H matrix, and wherein N=4 or N=6.

5. The method of claim 3, wherein the parity check matrix H is represented as H=[$H_1$, $H_2$], where $H_1$ is the parity part and $H_2$ is the systematic part, wherein both $H_1$ and $H_2$ are composed of blocks of circulant permutation matrices and zero matrices of block size Q, where Q is an integer.

6. The method of claim 1, wherein the demodulating the received signal to produce data includes operating a slicer and a log likelihood ratio (LLR) computer on intermediate data generated from the received signal.

7. The method of claim 6, wherein the LLR computer is either a symbol-wise LLR computer or a bit-wise LLR computer.

8. The method of claim 7, wherein the symbol-wise LLR computer calculates LLR for a LDPC symbol $s^{(c)}=x_1x_2 \ldots x_c$ using:

$$LLR(s^{(c)} = x_1 x_2 \ldots x_c) = \ln \left[ \frac{\sum_{i=1}^{\alpha} P(s^{(c)} = x_1 x_2 \ldots x_c) / y(k)}{\sum_{i=1}^{\beta} P(s^{(c)} = 0_1 0_2 \ldots 0_c) / y(k)} \right]$$

where P is a probability function, i is an integer, c is an integer number of consecutive bits of a constellation in the signal modulated using the OTFS modulation scheme, and x and y represent transmitted and received constellation points, respectively.

9. The method of claim 1, wherein the decoding the data includes performing decoding using either a flooding type algorithm or a layered algorithm.

10. The method of claim 1, wherein the receiving the signal includes receiving a radio frequency signal over the air, receiving the radio frequency signal over a wire, or receiving an optical signal over a fiber optic cable.

11. A non-transitory computer-readable storage medium having code stored thereon, the code comprising instructions, when executed, causing a processor to implement a method for forward error correction, comprising:
   instructions for receiving, over a channel, a signal that is modulated using an orthogonal time frequency space (OTFS) modulation scheme;
   instructions for demodulating the signal to produce data;
   instructions for decoding the data, via a non-binary low density parity check (NB-LDPC) code, by formulating the NB-LDPC code as a matrix with binary and non-binary entries; and
   instructions for providing an output of the decoding to a data sink,
   wherein a parity matrix H for the NB-LDPC code is based on a binary H matrix, and
   wherein the binary H matrix is based on a computer search algorithm configured to add offsets to entries in a first column and entries in a first row of the binary H matrix such that the first column and the first row contain only identity elements.

12. The storage medium of claim 11, wherein the NB-LDPC code comprises a structured regular systematic repeat accumulate code over a non-binary field, and wherein the parity matrix H for the NB-LDPC code comprises a non-binary matrix generated from the binary H matrix.

13. The storage medium of claim 11, wherein the instructions for demodulating the signal comprises:
   instructions for operating a slicer and a log likelihood ratio (LLR) computer on intermediate data generated from the signal.

14. The storage medium of claim 13, wherein the LLR computer is either a symbol-wise LLR computer or a bit-wise LLR computer.

15. An apparatus for forward error correction performed at a receiver, comprising:
   a reception circuit configured to receive, over a channel, a signal that is modulated using an orthogonal time frequency space (OTFS) modulation scheme; and
   a processor, coupled to the reception circuit, configured to:
      demodulate the signal to produce data,
      decode the data, via a non-binary low density parity check (NB-LDPC) code, by formulating the NB-LDPC code as a matrix with binary and non-binary entries, and
      provide an output of the decoding to a data sink,
      wherein a parity matrix H for the NB-LDPC code is based on a binary H matrix, and wherein the binary H matrix is based on a computer search algorithm configured to add offsets to entries in a first column and entries in a first row of the binary H matrix such that the first column and the first row contain only identity elements.

16. The apparatus of claim 15, wherein the NB-LDPC code comprises a structured regular systematic repeat accumulate code over a non-binary field, and wherein the parity matrix H for the NB-LDPC code comprises a non-binary matrix generated from the binary H matrix.

17. The apparatus of claim 15, wherein the processor is configured, as part of demodulating the signal, to:
   operate a slicer and a log likelihood ratio (LLR) computer on intermediate data generated from the signal.

18. The apparatus of claim 17, wherein the LLR computer is either a symbol-wise LLR computer or a bit-wise LLR computer.

19. The apparatus of claim 15, wherein the decoding the data includes performing decoding using either a flooding type algorithm or a layered algorithm.

* * * * *